United States Patent
Finn et al.

(10) Patent No.: US 10,783,426 B2
(45) Date of Patent: Sep. 22, 2020

(54) DUAL-INTERFACE METAL HYBRID SMARTCARD

(71) Applicants: David Finn, Tourmakeady (IE); Mustafa Lotya, Celbridge (IE); Darren Molloy, Galway (IE)

(72) Inventors: David Finn, Tourmakeady (IE); Mustafa Lotya, Celbridge (IE); Darren Molloy, Galway (IE)

( * ) Notice: Subject to any disclaimer, the term of this patent is extended or adjusted under 35 U.S.C. 154(b) by 129 days.

(21) Appl. No.: 16/260,110

(22) Filed: Jan. 29, 2019

(65) Prior Publication Data

US 2020/0005114 A1 Jan. 2, 2020

Related U.S. Application Data

(63) Continuation-in-part of application No. 15/969,816, filed on May 3, 2018, now Pat. No. 10,518,518, (Continued)

(51) Int. Cl.
*G06K 19/06* (2006.01)
*G06K 19/077* (2006.01)
(Continued)

(52) U.S. Cl.
CPC . *G06K 19/07794* (2013.01); *G06K 19/07769* (2013.01); *G06K 19/07783* (2013.01); *H01Q 1/2216* (2013.01); *H01Q 1/2225* (2013.01); *H01Q 1/2283* (2013.01); *H01Q 7/00* (2013.01); *H01Q 21/29* (2013.01); *H05K 1/165* (2013.01);
(Continued)

(58) Field of Classification Search
CPC ....... G06K 19/07794; G06K 19/07769; G06K 19/07783; H01Q 1/2216; H01Q 1/2225; H01Q 1/2288; H01Q 7/00; H01Q 21/29; H05K 1/165; H05K 3/103;
(Continued)

(56) References Cited

U.S. PATENT DOCUMENTS 6,233,818 B1 5/2001 Finn et al.
6,373,447 B1 4/2002 Rostoker et al.
(Continued)

FOREIGN PATENT DOCUMENTS

| EP | 2063489 | 5/2009 |
|----|---------|--------|
| EP | 1854222 | 6/2012 |
| EP | 2541471 | 1/2013 |

*Primary Examiner* — Karl D Frech
(74) *Attorney, Agent, or Firm* — Gerald E. Linden

(57) ABSTRACT

A dual-interface metal hybrid smartcard comprising a plastic card body (CB), a booster antenna (BA) and a metal frame (CMF, DMF) disposed in the card body, in the form of a rectangular metal frame disposed external to the booster antenna (BA). The metal frame may extend continuously around the periphery of the card body as a continuous metal frame (CMF), or may have a slit (S), thereby forming a discontinuous metal frame (DMF). A second metal slug (MS-2) may be disposed at a lower portion of the card body (CB), inside the booster antenna. A smartcard may comprise a plastic card body (CB) and a generally rectangular metal slug (MS) having a main body portion slightly smaller than the card body, and having at least one protrusion extending from corresponding at least one corner of the main body portion of the metal slug to corresponding at least one corner of the card body.

17 Claims, 10 Drawing Sheets

Related U.S. Application Data which is a continuation-in-part of application No. 15/939,281, filed on Mar. 29, 2018, now Pat. No. 10,733,494, which is a continuation-in-part of application No. 15/358,138, filed on Nov. 22, 2016, now Pat. No. 9,960,476, which is a continuation-in-part of application No. 15/072,356, filed on Mar. 17, 2016, now Pat. No. 9,836,684, which is a continuation-in-part of application No. 14/619,177, filed on Feb. 11, 2015, now abandoned, and a continuation-in-part of application No. 14/492,113, filed on Sep. 22, 2014, now Pat. No. 9,798,968, and a continuation-in-part of application No. 14/465,815, filed on Aug. 21, 2014, now Pat. No. 9,475,086, said application No. 14/492,113 is a continuation-in-part of application No. 14/173,815, filed on Feb. 6, 2014, now Pat. No. 9,195,932, said application No. 14/465,815 is a continuation-in-part of application No. 14/173,815, filed on Feb. 6, 2014, now Pat. No. 9,195,932, which is a continuation of application No. 14/020,884, filed on Sep. 8, 2013, now Pat. No. 9,033,250, said application No. 14/492,113 is a continuation-in-part of application No. 13/744,686, filed on Jan. 18, 2013, now abandoned, said application No. 14/020,884 is a continuation-in-part of application No. 13/600,140, filed on Aug. 30, 2012, now Pat. No. 8,991,712.

(51) Int. Cl.

| | | |
|---|---|---|
| *H01Q 1/22* | (2006.01) | |
| *H01Q 7/00* | (2006.01) | |
| *H05K 1/16* | (2006.01) | |
| *H01Q 21/29* | (2006.01) | |
| *H05K 3/10* | (2006.01) | |
| *H01F 38/14* | (2006.01) | |

(52) U.S. Cl.
CPC .............. *H01F 38/14* (2013.01); *H05K 3/103* (2013.01); *H05K 2201/10098* (2013.01); *Y10T 29/49018* (2015.01); *Y10T 29/49162* (2015.01)

(58) Field of Classification Search
CPC .... H05K 2201/10098; Y01T 29/99018; Y01T 29/49162
USPC .......................................... 235/492, 487, 488
See application file for complete search history.

(56) References Cited

U.S. PATENT DOCUMENTS

| | | |
|---|---|---|
| 6,378,774 B1 | 4/2002 | Emori |
| 6,581,839 B1 | 6/2003 | Lasch et al. |
| 6,698,089 B2 | 3/2004 | Finn et al. |
| 6,749,123 B2 | 6/2004 | Lasch et al. |
| 6,764,014 B2 | 7/2004 | Lasch et al. |
| 6,986,465 B2 | 1/2006 | Kiekhaefer |
| 7,306,158 B2 | 12/2007 | Berardi et al. |
| 7,377,443 B2 | 5/2008 | Lasch et al. |
| 7,440,771 B2 | 10/2008 | Purk |
| 7,494,057 B2 | 2/2009 | Lasch et al. |
| 7,530,491 B2 | 5/2009 | Lasch et al. |
| 7,544,266 B2 | 6/2009 | Herring et al. |
| 7,588,184 B2 | 9/2009 | Gandel et al. |
| 7,607,583 B2 | 10/2009 | Berardi et al. |
| 7,721,956 B2 | 5/2010 | Williams et al. |
| 7,757,957 B2 | 7/2010 | Cranston et al. |
| 7,819,310 B2 | 10/2010 | Lasch et al. |
| 7,823,777 B2 | 11/2010 | Varga et al. |
| 7,837,116 B2 | 11/2010 | Morril Webb et al. |
| 7,980,477 B2 | 7/2011 | Finn |
| 8,033,457 B2 | 10/2011 | Varga et al. |
| 8,066,190 B2 | 11/2011 | Faenza, Jr. |
| 8,079,514 B2 | 12/2011 | Lasch et al. |
| 8,100,337 B2 | 1/2012 | Artigue et al. |
| 8,130,166 B2 | 3/2012 | Ayala et al. |
| 8,186,582 B2 | 5/2012 | Varga et al. |
| 8,186,598 B2 | 5/2012 | Faenza, Jr. |
| 8,191,788 B2 | 6/2012 | Morrill-Webb et al. |
| 8,261,997 B2 | 9/2012 | Gebhart |
| 8,344,958 B2 | 1/2013 | Artigue et al. |
| 8,360,312 B2 | 1/2013 | Varga et al. |
| 8,366,009 B2 | 2/2013 | Finn et al. |
| 8,393,547 B2 | 3/2013 | Kiekhaefer et al. |
| 8,474,726 B2 | 7/2013 | Finn |
| 8,523,062 B2 | 9/2013 | Varga et al. |
| 8,544,743 B2 | 10/2013 | Hong et al. |
| 8,544,756 B2 | 10/2013 | Bosquet et al. |
| 8,672,232 B2 | 3/2014 | Herslow |
| 8,857,722 B2 | 10/2014 | Mosteller |
| 8,991,712 B2 * | 3/2015 | Finn ............... H01Q 1/2283 235/492 |
| 9,033,250 B2 | 5/2015 | Finn et al. |
| 9,195,932 B2 | 11/2015 | Finn et al. |
| 9,272,370 B2 | 3/2016 | Finn et al. |
| 9,390,364 B2 | 7/2016 | Finn et al. |
| 9,475,086 B2 | 10/2016 | Finn et al. |
| 9,798,968 B2 | 10/2017 | Finn et al. |
| 2003/0057288 A1 | 3/2003 | Salzgeber |
| 2009/0169776 A1 | 7/2009 | Herslow |
| 2010/0078329 A1 | 4/2010 | Mirsky et al. |
| 2010/0230309 A1 * | 9/2010 | Kiyozuka .......... G06K 19/0723 206/320 |
| 2011/0189620 A1 | 8/2011 | Herslow |
| 2012/0223146 A1 | 9/2012 | Reed et al. |
| 2013/0062419 A1 | 3/2013 | Finn et al. |
| 2013/0075477 A1 | 3/2013 | Finn et al. |
| 2013/0126622 A1 | 5/2013 | Finn |
| 2013/0168454 A1 | 7/2013 | Oh et al. |
| 2013/0320095 A1 | 12/2013 | Blum |
| 2014/0021261 A1 | 1/2014 | Mosteller |
| 2014/0052630 A1 | 2/2014 | Bona et al. |
| 2014/0070009 A1 | 3/2014 | Zambrano |
| 2014/0091149 A1 | 4/2014 | Finn et al. |
| 2014/0104133 A1 | 4/2014 | Finn et al. |
| 2014/0138443 A1 | 5/2014 | Blum |
| 2014/0144993 A1 | 5/2014 | Seo et al. |
| 2014/0152511 A1 | 6/2014 | Merlin et al. |
| 2014/0166762 A1 | 6/2014 | Herslow |
| 2014/0284386 A1 | 9/2014 | Finn et al. |

\* cited by examiner

Dual Interface (DI) Smart Card, and Readers an exemplary booster antenna (BA)

different areas of the Card Body (CB)

inclusion of an antenna extension AE

Metal Slug (MS) comprising two components (MS-1, MS-2)

LED connected to free ends of booster antenna (BA)

DUAL-INTERFACE METAL HYBRID SMARTCARD

CROSS-REFERENCE TO RELATED APPLICATIONS

This application claims filing date benefit (priority), as a nonprovisional or continuation-in-part from the following U.S. provisional and nonprovisional patent applications, all of which are incorporated by reference herein:

This is a continuation-in-part of Ser. No. 15/969,816 filed 3 May 2018
- Ser. No. 15/969,816 is a continuation-in-part of Ser. No. 15/939,281 filed 29 Mar. 2018
- Ser. No. 15/939,281 is continuation-in-part of Ser. No. 15/358,138 filed 22 Nov. 2016
- Ser. No. 15/358,138 is a continuation-in-part of Ser. No. 15/072,356 filed 17 Mar. 2016
  - Ser. No. 15/072,356 is a continuation-in-part of Ser. No. 14/619,177 filed 11 Feb. 2015
    - Ser. No. 14/619,177 is a nonprovisional 62/048,373 filed 10 Sep. 2014
  - Ser. No. 15/072,356 is a continuation-in-part of Ser. No. 14/492,113 filed 22 Sep. 2014
    - Ser. No. 14/492,113 is a continuation-in-part of Ser. No. 14/173,815 filed 6 Feb. 2014
    - Ser. No. 14/492,113 is a continuation-in-part of Ser. No. 13/744,686 filed 18 Jan. 2013
  - Ser. No. 15/072,356 is a continuation-in-part of Ser. No. 14/465,815 filed 21 Aug. 2014
    - Ser. No. 14/465,815 is a nonprovisional of 61/978,187 filed 10 Apr. 2014
    - Ser. No. 14/465,815 is a nonprovisional of 61/971,636 filed 28 Mar. 2014
    - Ser. No. 14/465,815 is a nonprovisional of 61/955,325 filed 19 Mar. 2014
    - Ser. No. 14/465,815 is a continuation-in-part of Ser. No. 14/173,815 filed 6 Feb. 2014
      - Ser. No. 14/173,815 a continuation of Ser. No. 14/020,884 filed 8 Sep. 2013
      - Ser. No. 14/020,884 is a continuation-in-part of Ser. No. 13/600,140 filed 30 Aug. 2012

TECHNICAL FIELD

This disclosure may relate to solid metal, metal foil, metal composite and other metal "hybrid" smartcards (or smart cards), which may also be referred to as "transaction cards" or "chip cards", operating at least in a contactless mode (ISO 14443), and optionally also in a contact mode (ISO 7816). Such cards may have a substantial amount (or "slug") of metal, such as tungsten, incorporated into the card body (CB) thereof, and may be referred to as ""weighted transaction cards". This metal slug may increase the perceived value of a smartcard, which usually has a plastic card body (CB), by increasing its weight to 15 grams (for example) and giving it a metallic "feel".

A smartcard operating in both contact and contactless modes may be referred to as a "dual-interface" (DI, or DIF) smartcard. A dual-interface smartcard may incorporate an antenna module (AM) incorporating a module tape (MT) substrate, a dual-interface RFID (radio frequency identification) chip mounted to the module tape, a module antenna (MA) for enabling contactless connections (ISO 14443) mounted to the module tape, and contact pads (CPs) mounted to the module tape for enabling contact connections (ISO 7816). The dual-interface smartcard may also incorporate a booster antenna (BA) in its card body (CB) substrate (which may be referred to as an "inlay substrate"), and the booster antenna (BA) may have several interconnected components such as a card antenna (CA) component disposed around an outer perimeter area of the card body for coupling with an external reader, a coupling coil (CC) component disposed at an interior area of the card body for coupling with the module antenna (MA) of the antenna module (AM) and an extension antenna (EA) component disposed at an interior area of the card body for enhancing the performance of the booster antenna (BA).

Having a large mass of metal in the card body may adversely affect contactless operation of the smartcard, such as attenuating RF coupling between the antenna module (AM) and an external contactless reader, thereby requiring innovative solutions to overcome these adverse effects. Hence, metal smartcards generally operate only in the contact mode (ISO 7816). Various solutions for improving contactless coupling in a hybrid card having a metal slug incorporated therein may be disclosed herein.

BACKGROUND

A smartcard (SC) may generally comprise a card body (CB) or inlay substrate, an antenna module (AM), and a booster antenna (BA). The antenna module (AM), or transponder chip module may comprise an RFID (radio frequency identification) chip or chip module (either of which may be referred to as "CM", or "IC") and a module antenna (MA), forming a transponder. The RFID chip (CM) may be mounted on a module tape (MT) or other substrate, typically having 6 or 8 contact pads (CP) on a "face-up" side for interfacing with an external contact reader in a contact mode (ISO 7816). A booster antenna (BA) may be incorporated into the card body of the smart card (SC). The booster antenna (BA) may comprise various antenna components, such as a card antenna (CA) for coupling with an external contactless reader, a coupling coil (CC) component for coupling with the module antenna (MA) of the antenna module (AM), and an extension antenna (EA) component connected with one or both of the card antenna (CA) component or coupler coil (CC) component for improving overall performance. The booster antenna (BA) facilitates communication between the antenna module (AM) and an external contactless reader (ISO 14443). Dual-interface (DI, or DIF) smartcards (or smart cards) may comprise an antenna module (AM) or transponder chip module (TCM) with a number of (typically 6 or 8) contact pads (CP) connected with an RFID chip (CM), typically via wire bonds or flip chip assembly, and a booster antenna (BA) in the card body (CB).

The antenna module AM or transponder chip module TCM may generally comprise a dual-interface (DI, DIF) RFID chip (bare, unpackaged silicon die) or chip module (a die with leadframe, carrier, redistribution substrate, interposer or the like)—either of which may be referred to as "CM" or "IC"—mounted to a module tape MT. A module antenna MA may be disposed on the module tape MT, or other suitable substrate, for implementing a contactless interface. Contact pads CP may be disposed on the module tape MT for implementing the contact interface. The module tape MT may comprise a pattern of interconnects (conductive traces and pads) to which the chip CM and contact pads CP may be connected.

The module antenna MA may be formed as a planar antenna by a subtractive process such as by laser etching or chemical etching an antenna structure on the face-down side of the module tape (MT). The module antenna (MA) may be a planar coil having several turns extending to the perimeter of the antenna module (AM). Reference may be made to US 2013/0126622. Alternatively, the module antenna may be a wire wound coil formed around the dam of the chip encapsulation. Reference may be made to US 2013/0062419 (U.S. Pat. No. 8,789,762, 29 Jul. 2014).

To increase the perceived value of a smartcard, which usually has a plastic card body (CB), its weight may be increased by incorporating a slab of metal or a metal composite into its construction. The slab of metal may be a metal slug smaller in size than the card body, or the slab of metal may extend to the perimeter of an ISO smartcard. The slug or slab may comprise tungsten, and may be referred to as a "tungsten member".

A module antenna (MA) connected to an RFID chip (CM) may be referred to as a "transponder". Generally, such a transponder is a "passive" transponder which does not have its own power source (e.g., battery), but rather which harvests power from an external reader (interrogator).

Some Patent References

U.S. Pat. No. 8,033,457 (American Express) describes a method of creating a single transaction card is disclosed and comprises embossing the single transaction card within a pocket to form embossed characters on a first surface of the single transaction card, filling the pocket with a fill panel to provide a substantially flush surface on a second surface of the single transaction card, wherein a third surface of the fill panel is in uniform, direct contact with an interior of the pocket. Another method is disclosed for machining a face pocket within a single transaction card and disposing a microchip therein. In various embodiments, a single transaction card is comprised of a continuous metal layer, such as, for example, titanium.

U.S. Pat. No. 8,393,547 (Perfect Plastic Printing) describes a contactless financial transaction card includes a plastic inlay having first and second substantially planar surfaces bounded by a continuous peripheral edge. An integrated circuit carried by the inlay stores card-specific data. An antenna carried by the inlay is operatively connected to the integrated circuit. The foil layer provides the financial transaction card with a decorative metallic reflective appearance and is constructed to permit the antenna to inductively couple with the card reader within the maximum coupling distance. Printed graphics or text may be disposed on or above the metallic foil layer. The card is constructed to inductively couple with a card reader that is spaced from the card in order to support limited-range wireless communication between the card and the card reader up to a maximum coupling distance, beyond which it will not couple.

US 2012/0223146 (VISA) describes payment cards and methods for making payment cards. A card comprises a first layer and a second layer adjacent to the first layer. The second layer comprises a plurality of particles comprising metal, and the plurality of particles comprise at least about 15 volume % of the second layer. In another embodiment, a mixture is prepared comprising polymer and a plurality of particles comprising metal. The plurality of particles comprise at least about 15 volume % of the mixture. The mixture is pressed and an outer layer is applied. The mixture and outer layer are then cut to form the card.

US 2013/0126622 (Finn) describes a dual-interface smart card having a booster antenna with coupler coil in its card body, and a metallized face plate having a window opening for the antenna module. Performance may be improved by one or more of making the window opening substantially larger than the antenna module, providing perforations through the face plate, disposing ferrite material between the face plate and the booster antenna. Additionally, by one or more of modifying contact pads on the antenna module, disposing a compensating loop under the booster antenna, offsetting the antenna module with respect to the coupler coil, arranging the booster antenna as a quasi-dipole, providing the module antenna with capacitive stubs, and disposing a ferrite element in the antenna module between the module antenna and the contact pads.

US 2014/0052630 (X-Core Technologies/X-Card Holdings) describes a smart card usable in magnetic stripe swipe transactions with a transaction terminal configured to read transaction information encoded on a magnetic stripe of a standard transaction card includes a card body, which includes a magnetic stripe emulator for use with the transaction terminal, a smart card chip programmed with at least one transaction application for providing secured data for use in a transaction and dynamic card verification data, a power supply, and a card controller in communication with the magnetic stripe emulator. The card controller is configured to receive the dynamic card verification data and control the magnetic stripe emulator to emit a magnetic field encoded with at least a portion of the secured data and the dynamic card verification data.

U.S. Pat. No. 8,672,232 (Herslow) describes a card formed in accordance with the invention includes a first assembly comprised of multiple plastic layers attached via an adhesive to a metal layer. The multiple plastic layers forming the first assembly are laminated under a first selected temperature and pressure conditions to preshrink the multiple plastic layers, stress relieve the first assembly and render the first assembly dimensionally stable. The laminated first assembly is then attached to a metal layer via an adhesive layer to form a second assembly which is then laminated at a temperature below the first selected temperature to form a card which is not subjected to warpage and delamination.

US 2011/0189620 (Herslow) describes a method and apparatus for treating a selected region of a metal layer, used to form a metal card, by annealing the selected metal region so the selected region becomes soft and ductile, while the rest of the metal layer remains stiff. The softened, ductile, selected metal region can be embossed with reduced power and with reduced wear and tear on the embossing equipment. Alternatively, the annealed metal layer can undergo additional processing steps to form an assembly which can then be embossed. The method may include the use of a fixture for holding the metal layer, with the fixture having a window region for enabling heat to be applied to soften the region of the metal layer within the window region. The fixture includes apparatus for cooling the portion of the metal layer outside of the window region and for preventing the temperature of the metal layer outside the window region from rising above predetermined limits.

US 2013/0168454 (Hyundai) describes a metal payment card and a method of manufacturing same. The metal payment card has a main body made from at least one of a liquid alloy, aluminum alloy and copper alloy. The main body has a tangible pattern region.

US 2013/0320095 (Black Card) describes a transaction card having a first layer and a second layer, wherein the first layer is metal and the second layer is carbon.

U.S. Pat. No. 8,857,722 (CPI Card Group) describes a weighted transaction cards and methods of manufacturing the same. The weighted transaction cards may include a tungsten member that comprises at least a portion of a layer of the transaction card. The tungsten member may be encapsulated and/or disposed in an opening of a surround to define and inlay. The inlay may be laminated with one or more additional layers according to traditional card manufacturing techniques (e.g., a hot lamination process). The weighted transaction cards may have a weight significantly greater than traditional plastic transaction cards such that the weighted transaction cards.

U.S. Pat. No. 8,523,062 (American Express) describes a method of creating a single transaction card is disclosed and comprises embossing the single transaction card within a pocket to form embossed characters on a first surface of the single transaction card, filling the pocket with a fill panel to provide a substantially flush surface on a second surface of the single transaction card, wherein a third surface of the fill panel is in uniform, direct contact with an interior of the pocket. Another method is disclosed for machining a face pocket within a single transaction card and disposing a microchip therein. In various embodiments, a single transaction card is comprised of a continuous metal layer, such as, for example, titanium.

U.S. Pat. No. 8,544,756 (Oct. 1, 2013, Bosquet et al., Oberthur) discloses a smart card comprises a module having a microcircuit and a body including a cavity for receiving the module, wherein the cavity defines at least one surface area for fastening the module in the cavity, the body being formed by a stack of at least first and second layers respectively presenting weak adhesion and strong adhesion with the module. The area extends in the weak adhesion layer and includes at least one hole leading to the strong adhesion layer so as to form an anchor point for the module directly with said layer.

SUMMARY

It is a general object of the invention(s) disclosed herein to improve the performance of solid metal, metal foil, metal composite and other metal "hybrid" smartcards, payment objects made of metal or metallized surface, operating at least in a contactless mode (ISO 14443). Another object may be to improving coupling between a smartcard operating at least in a contactless mode (ISO 14443) and an external contactless reader.

Antenna components of a booster antenna BA may be routed around a metal slug in a metal "hybrid" smartcard to avoid attenuation of the RF field by the metal. Machining openings or creating perforations in the metal slug may offset (reduce) the effects of RF shielding.

Pre-laminating a metal slug or metal slugs of different thicknesses and shape in an inlay construction for later lamination with printed cores and overlay protective layers. Such metal slug or slugs, made of a highly dense metal such as tungsten, gives the ISO card body a weight greater than 15 grams. To enhance the performance of the DIF (dual-interface) system, magnetic particles can be selectively deposited on a carrier layer around the area of the metal slug.

The tungsten slug or alloys of tungsten can be machined in such a way as to allow for a booster antenna with its various antenna components to be embedded into or onto an inlay substrate (or card body) supporting the metal slug. The antenna structures (components of the booster antenna) can reside outside the area of the metal slug or partially overlap the area of the metal. Alternatively, one of two or more portions of the metal slug, or one of two or more isolated metal elements constituting the overall metal slug, may be disposed around the booster antenna. One of these isolated metal elements may be a continuous or discontinuous metal frame may be disposed around a peripheral card antenna (CA) component of the booster antenna (BA). A metal slug or a non-continuous metal frame may be laminated into a plastic card body.

The metal slug may have perforations, channels or openings to enhance the transmission of data from the smartcard in an electromagnetic field generated by a reader, and may improve the ability of the smartcard to harvest energy from the RFID reader. This latter feature is important in the context of passive smartcards which are powered solely by harvesting energy supplied by an external RFID reader.

Tungsten foils or non-magnetic metal foils having a high density (of approximately 19.3 gm/cc) can be used in the form of a stack to give weight to the card body. The skin depth of tungsten at 13.56 MHz is 30 µm.

Metal wire, metal meshes or metal foils could be used to secure the metal layer (metal slug, metal slab) or layers to standard plastic card body material before or during lamination.

The metal layer (foil or slug, or slab) may be provided with an opening for receiving an antenna module (AM) or transponder chip module (TCM), and may further be provided with a slit extending from the opening for an antenna module (AM) or transponder chip module (TCM) to a peripheral edge of the metal layer or slug, making the metal layer (foil or slug) discontinuous or non-continuous, in the manner of an open-loop frame surrounding the antenna module (AM) or transponder chip module (TCM). Such a frame may be referred to as a "coupling frame" (CF). Some examples of coupling frames incorporated into the card bodies of smartcards may be disclosed in:

Ser. No. 14/492,113 filed 22 Sep. 2014 (U.S. Pat. No. 9,798,968)

Ser. No. 14/465,815 filed 21 Aug. 2014 (U.S. Pat. No. 9,475,086)

Ser. No. 14/551,376 filed 24 Nov. 2014 (U.S. Pat. No. 9,390,364)

U.S. Ser. No. 14/465,815 (U.S. Pat. No. 9,475,086) discloses, for example, a conductive coupling frame (CF) having two ends, forming an open loop, disposed surrounding and closely adjacent a transponder chip module (TCM), and substantially coplanar with an antenna structure (AS, LES) in the transponder chip module (TCM). A metal card body (MCB) having a slit (S) extending from a module opening (MO) to a periphery of the card body to function as a coupling frame (CF). The coupling frame (CF) may be thick enough to be non-transparent to RF at frequencies of interest.

Metal particles such as tungsten could be deposited on a carrier material to create a thin metal sheet. Such sheet or sheets could be attached to a metal slug to provide extra weight to the card body.

Holographic metal foil can be used to tune or de-tuned the resonance frequency of the system. The holographic foil may also act as an ESD protector when inserting the card body into a terminal. The holographic metal foil may also be non-conductive if the foil has been patterned.

An inductively coupled LED positioned in the card body may be used to visually indicate a contactless transaction.

According to some embodiments of the invention, a dual-interface metal hybrid smartcard may comprise: a plastic card body (CB); a metal slug (MS) disposed in the card body; and a booster antenna (BA) disposed in the card body. The metal slug may have a surface area which is at least 50% (including at least 60%, at least 70%, at least 80%, at least 90%, and up to 100%) of a surface area of the card body, and may comprise titanium or alloys thereof. A antenna chip module (AM) having an antenna (MA) and contact pads (CP) may be disposed in an opening of the card body. The metal slug may be formed in such a way as to allow for the insertion or placement of the booster antenna (BA) and its components into or onto the card body. The booster antenna may be formed on an antenna substrate (AS) which is separate from the card body (CB) with metal slug (MS), and later joined thereto. The metal slug may comprise two or more separate metal slug components (MS-1, MS-2), which may overlap one another or which may be disposed at different locations in the card body (CB), without overlapping one another. A first metal slug component (MS-1) may be disposed at an upper portion of the card body; and a second metal slug component (MS-2) may be disposed at a lower portion of the card body. The first metal slug component (MS-1) may be disposed around a perimeter of the card body; and the second metal slug component (MS-2) may be disposed at an interior location of the card body. The first metal slug component (MS-1) may be disposed external to the card antenna (CA) component of the booster antenna (BA), and may not be behind the card antenna (CA) component. The second metal slug component (MS-2) may be disposed internal to the card antenna (CA) component of the booster antenna (BA). The first metal slug component (MS-1) may be in the form of a "closed loop" continuous metal frame around the perimeter of the card body, and may not be behind the card antenna component. The first metal slug component (MS-1) may be in the form of an "open loop" discontinuous metal frame around the perimeter of the card body, and may not be behind the card antenna component.

According to some embodiments of the invention, a dual-interface metal hybrid smartcard may comprise: a card body (CB); and an "open loop" metal frame (DMF) disposed around a peripheral area of the card body; and a booster antenna (BA) disposed inside the an internal area of the metal frame. The "open loop" metal frame may comprise a slit (S). Insulating layers (not shown) may be disposed on at least one side of the metal frame, covering the slit, and may comprise a dielectric medium such as an oxide layer.

The metal slug may be generally rectangular having a body portion slightly smaller than the periphery of the card body and having at least one corner portion (protrusions, ears) extending to corresponding at least one corners of the card body. Four corner portions of the metal slug may extend to respective four corners of the card body. The metal slug may comprise: an opening (WO) for accepting transponder chip module (TCM); and a slit extending from the opening to a peripheral edge of the metal slug. The slit may be filled or covered with a dielectric or oxide layer. The metal slug or metal frame with slit may be covered on at least one side thereof (optionally on both sides thereof), with a layer of plastic, thus covering the slit The disclosure may also relate to connecting an electronic device to the wire ends of the booster antenna (BA) in a smart card (SC) to harvest energy or to drive an LED to indicate the occurrence of a contactless transaction. The wire ends of the booster antenna can also be connected to a switch in order to enable or disenable a contactless transaction. The electronic device may also be a component such as a resistor, capacitor, inductor, transistor or cell.

The ends of the booster antenna may be connected to one or more electroluminescent components. The electroluminescent component may be a commercially available device (for example blue backlighting commonly used in LCD panels), an organic light emitting diode (OLED) or a composite system containing electroluminescent particles suspended in an electrically conductive polymer matrix. The electroluminescent component(s) will glow when the RFID device is placed in an RF field. The electroluminescent component(s) may be placed anywhere in the RFID device, the device having surface finishes that permit light transmission to the exterior of the device. In the case of a smartcard the electroluminescent component may be located on the booster inlay to facilitate ease of connection to the booster antenna. Alternatively, the electroluminescent component may be located on a second layer of the smartcard and be connected to the booster antenna using solder bumps. The outer layers of the smartcard may have transparent, semi-transparent or holographic finish, forming windows that permit light transmission to the exterior of the smartcard. These windows may be patterned or be in the form of a logo, such that the patterned area illuminates when the electroluminescent component is activated. A plurality of electroluminescent components may be connected to the booster antenna in order to give a plurality of illuminating regions of the RFID device. A metal slug may be provided with a hole (opening) to permit viewing of an LED disposed underneath the slug.

The ends of the booster antenna in an RFID device may be electrically connected to a capacitor. The capacitor may be connected to another component, for example an LED or rechargeable battery. A rectifying circuit may also be used in conjunction with the capacitor. When placed in the RF field the capacitor charges, for example during the execution of a transaction in a payment smartcard. When the payment smartcard, or other RFID device, is removed from the RF field the capacitor discharges. The discharge current from the capacitor can be fed to an LED, or other light emitting device, to indicate that the transaction has been completed. This has the effect of briefly turning on or brightening the LED to act as verification that a transaction completed. At different voltage levels the color of the LED can change. Alternatively, the discharge current from the capacitor may be used to re-charge a battery.

The disclosure may further relate to engraving, wire eroding, laser etching or punching a logo in a metal slug, metal plate, in a layer of metal particles or any metal composite material which is so dense that security scanners are unable to identify the object as a smartcard. Such embedded logo in the dense material or metal identifies its authenticity.

Security features may be provided for tungsten metal inserts, tungsten foils or non-magnetic metal foils having a high density (of approximately 19.3 gm/cc) used in the form of a stack, that are used to give weight to a smartcard body. The metal insert or stack may be laser or chemically etched with a pattern in the form of a logo, barcode or serial number. In the case of a stack of tungsten or non-magnetic foils one or more of the outer foil layers may be etched or punched with a pattern. Alternatively, an inner layer of the foil stack may carry a pattern such that the pattern is concealed by the remaining layers of the stack. The pattern formed will be visible under X-ray imaging, for example, as found in airport security scanners. This can allow authentication of the smartcard at security screening points where the high density metal such as tungsten may be incorrectly identified by an X-ray scanner as inorganic material normally associated as a suspect material. The pattern may be used as security feature to prevent fraud in smartcards bearing metal inserts.

The disclosure may relate to improvements in the overall construction of smartcards, particularly metal smartcards, more particularly metal smartcards which are DIF smartcards comprising a metal slug.

The disclosure may relate to preparing a metal slug having a thickness of approximately 300 μm for placement on a thin carrier layer of fleece, cotton, fiber mesh, paper or synthetic material such PVC, PC, PET-G or Teslin, and such metal slug having rounded edges and its surface sandblasted to have a rough finish for adhesive attachment to said carrier layer. The thin carrier layer may have magnetic particles incorporated into its structure or prepared with channels to accept magnetic particles. The position of the metal slug in a smartcard body may be below the magnetic stripe and several millimeters from the perimeter edge.

A metal slug (or frame) which is generally a few millimeters smaller than the card body of the smart card may be provided with protruding "ears" (outer portions) extending to the perimeter edge (or corners) of the card body, and may pass underneath the magnetic stripe.

The disclosure may relate to a variation of a metal smartcard in which a metal plate on the front side of the smartcard may bear credentials of the card holder (name, card serial number and expiry date). The metal plate may be constructed of a solid metal or metal alloy. The metal plate may comprise a material which is substantially non-magnetic and a poor electrical conductor. The front side of the smartcard may have no visible cavities or recesses and may comprise a continuous sheet of metal or metal alloy. The back side of the card may comprise PVC, PC, PET-G, Teslin or other synthetic material and may be a composite material containing a re-enforcing filler of graphene, graphite, carbon fiber or carbon nanotubes. The plastic layer may be attached to the front metal plate by an adhesive layer, which may comprise magnetic particles to offset effects of RF shielding caused by the metal plate. The back side of the card may have a metallic or metal foil finish. The back side of the card may comprise a composite material containing a re-enforcing filler of graphene, graphite, carbon fiber or carbon nanotubes.

In a DIF metal smartcard the antenna module (AM, or "antenna chip module") would normally placed in a cavity on the front side of the smartcard. As disclosed herein, the antenna module (AM) may be placed on the back side of the card in a pocket (or recess, or cavity) formed in the plastic or reinforced plastic layer. In this sense the antenna chip module is located on the same side of the smartcard as other components traditionally found on the back side of smartcards such as the magnetic stripe, signature panel and hologram.

A recess may be formed on the non-exposed (back) side of the metal plate on the front side of the card. The recess may be created by milling or etching, having a shape and size similar to the module antenna (MA) of the antenna module (AM). A stepped cavity may be milled out in the plastic side of the plastic metal smartcard to accommodate an antenna module (AM). The stepped cavity may be aligned with a cavity in the metal plate in order to accept the antenna module (AM). The recess on the reverse side of the metal plate provides additional space for the mold mass of the antenna chip module. Said non-exposed recess may incorporate magnetic shielding material.

The disclosure may relate to using a metal slug (or slab) to change or shift the resonance frequency of a booster antenna with its various antenna components such as its peripheral card antenna (CA) component routed around the perimeter of the smartcard, its coupler coil (CC) component positioned over an opening in the metal slug and its extension antenna (EA) component disposed in an available interior metal-free area of (or window opening in) the metal slug. The booster antenna (wound, embedded, etched or printed) is formed, placed or deposited on a separate layer sitting flush or almost flush with the level of the metal slug. A window or recess is prepared in this layer to accept the metal slug. The booster antenna is kept at a distance from the metal slug and the separation distance may be filed or prepared with magnetic particles.

According to some embodiments of the invention, a dual-interface metal hybrid smartcard may comprise: a card body (CB); an "open loop" metal frame (DMF) disposed around a peripheral area of the card body and having a slit (S) extending from an inner edge to an outer edge of the metal frame; and a booster antenna (BA) disposed inside an internal area of the metal frame.

According to some embodiments of the invention, a metal slug for a hybrid metal/plastic card body is generally rectangular having a body portion which is smaller than the periphery of the card body and having at least one corner portion extending as a protrusion to corresponding at least one corner of the card body.

According to some embodiments of the invention, a dual-interface metal hybrid smartcard may comprise: a plastic card body (CB); a booster antenna (BA) disposed in the card body and comprising a card antenna (CA) component disposed around a peripheral area of the card body, a coupler coil (CC) component disposed at an interior area of the card body around an opening (OP) for receiving an antenna module (AM) or transponder chip module (TCM); and a metal frame (CMF, DMF) disposed in the card body; in the form of a rectangular metal frame disposed external to the card antenna (CA) component of the booster antenna (BA).

According to some embodiments of the invention, a smartcard may comprise: a plastic card body (CB) having four corners; and a generally rectangular metal slug (MS) having a main body portion slightly smaller than the card body, and having at least one protrusion extending from corresponding at least one corner of the main body portion of the metal slug to corresponding at least one corner of the card body.

In their various embodiments, the invention(s) described herein may relate to industrial and commercial industries, such as RFID applications, payment (transaction) smartcards, payment objects, access control cards, smart jewelry wearable devices the like.

Other objects, features and advantages of the invention(s) disclosed herein, and their various embodiments, may become apparent in light of the descriptions of some exemplary embodiments that follows.

BRIEF DESCRIPTION OF THE DRAWINGS

Reference will be made in detail to embodiments of the disclosure, non-limiting examples of which may be illustrated in the accompanying drawing figures (FIGS.). The figures may generally be in the form of diagrams. Some elements in the figures may be exaggerated or drawn not-to-scale, others may be omitted, for illustrative clarity. Some figures may be in the form of diagrams.

When terms such as "left" and "right", "top" and "bottom", "upper" and "lower", "inner" and "outer", or similar terms are used in the description, they may be used to guide the reader to orientations of elements in the figures, but should be understood not to limit the apparatus being described to any particular configuration or orientation, unless otherwise specified or evident from context. Any text (legends, notes, reference numerals and the like) appearing on the drawings are incorporated by reference herein.

Although the invention may be illustrated in the context of various exemplary embodiments, it should be understood that it is not intended to limit the invention to these particular embodiments, and individual features of various embodiments may be combined with one another.

The drawings are exemplary of the various embodiments of the invention. To avoid cluttering the drawings, some features such as plated through holes, conductive traces for interconnects, bond pads, and other features may be omitted from the drawings. Passivation metallization layers may also be omitted for clarity.

Figure 1:
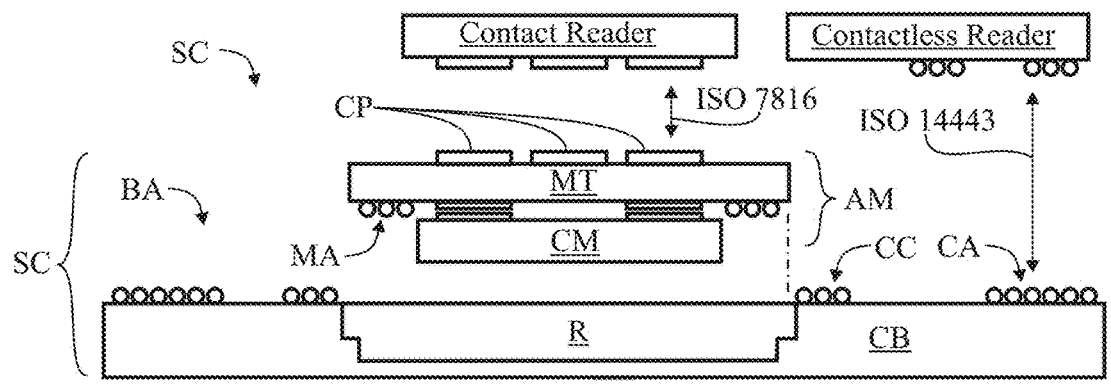

FIG. 1 is a diagram, in cross-section, of a dual-interface smartcard and readers.

Figure 1A:
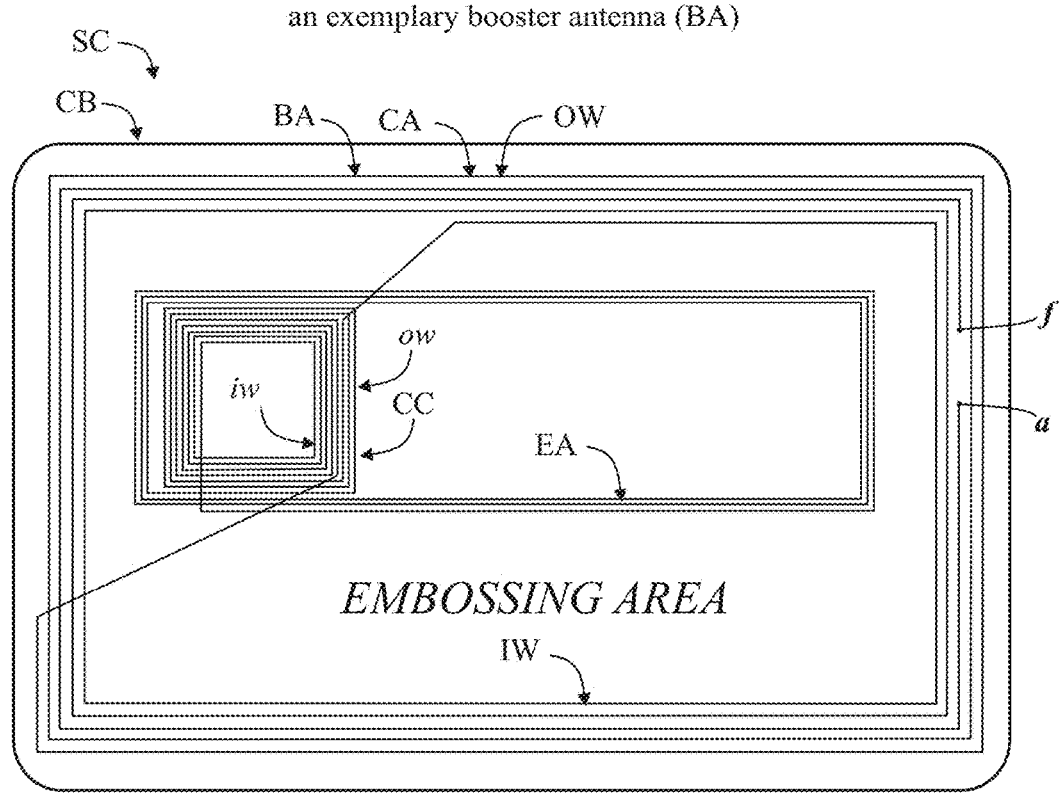

FIG. 1A is a diagram showing a configuration for a booster antenna (BA) of an smartcard having a card antenna (CA) component, a coupler coil antenna (CC) component and an extension antenna (EA) component.

Figure 1B:
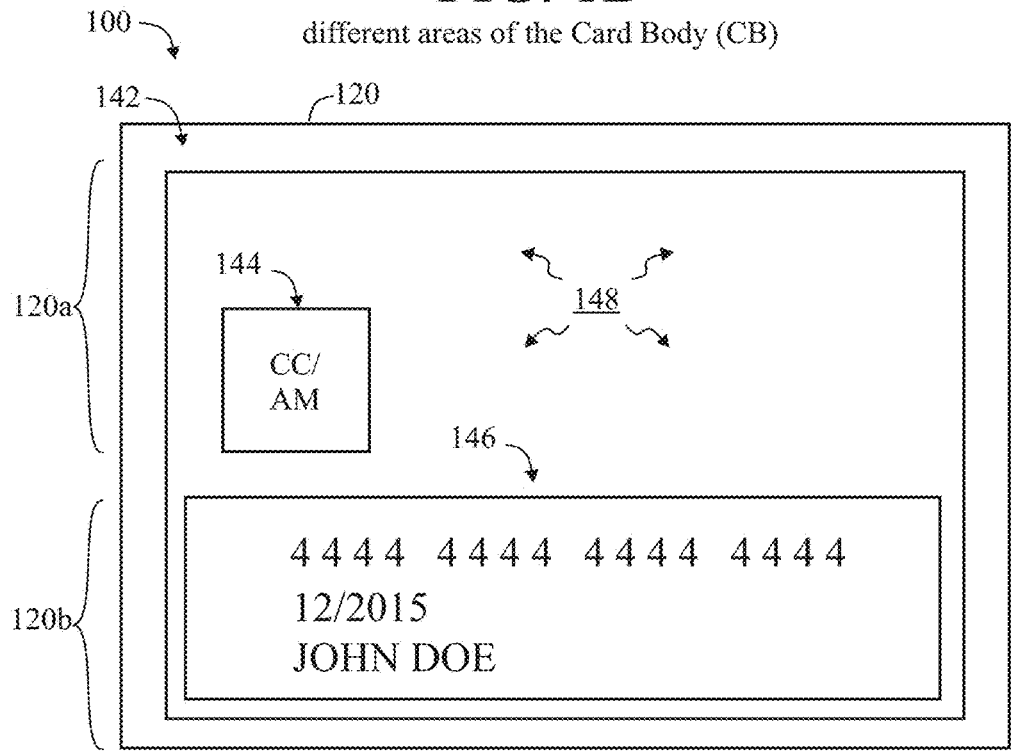

FIG. 1B (compare FIG. 1A of U.S. Ser. No. 14/020,884) is a top view of a card body (CB) for a smartcard.

Figure 1C:
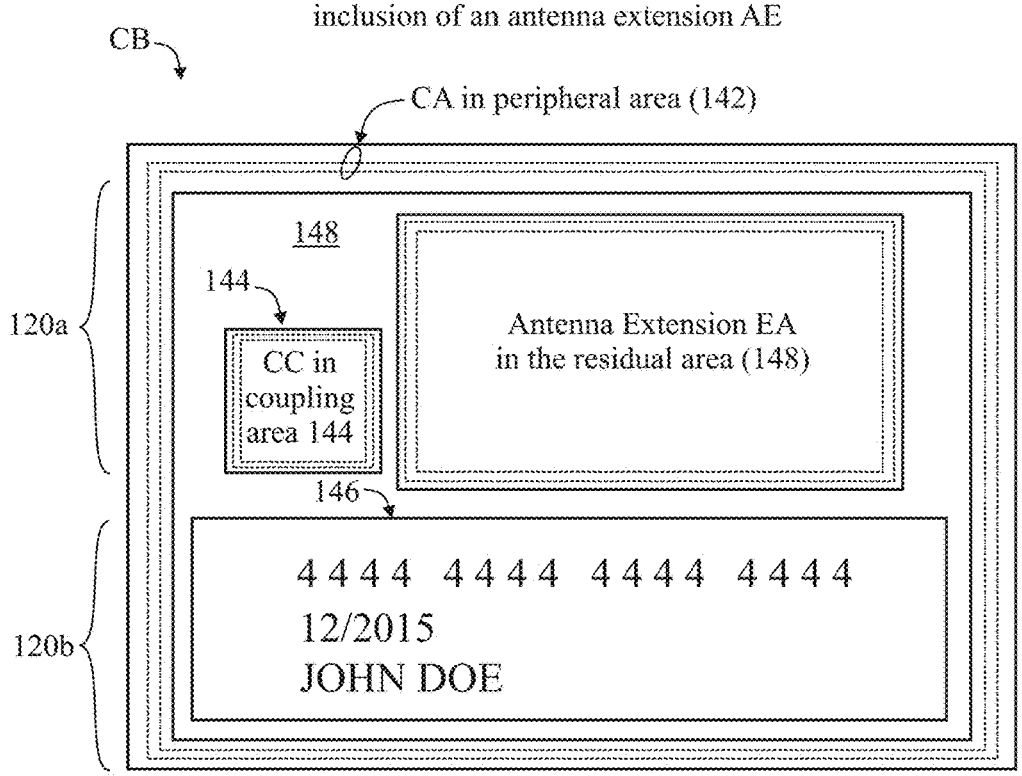

FIG. 1C (compare FIG. 3B of U.S. Ser. No. 14/020,884) is a diagram illustrating various areas of a card body CB of a smartcard.

Figure 2A:
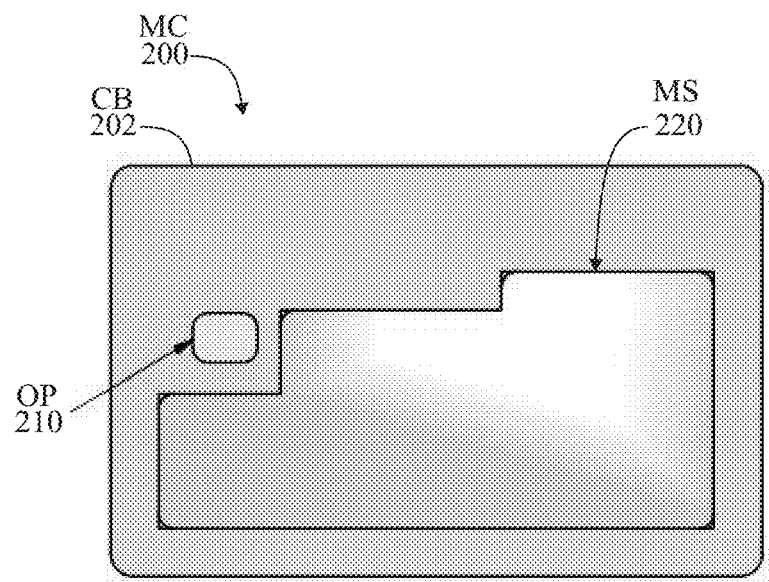

FIG. 2A is a front view of an inlay layer of a plastic card body with a metal slug, machined in such a way as to allow for the insertion or placement of a booster antenna with its various antenna components.

Figure 2B:
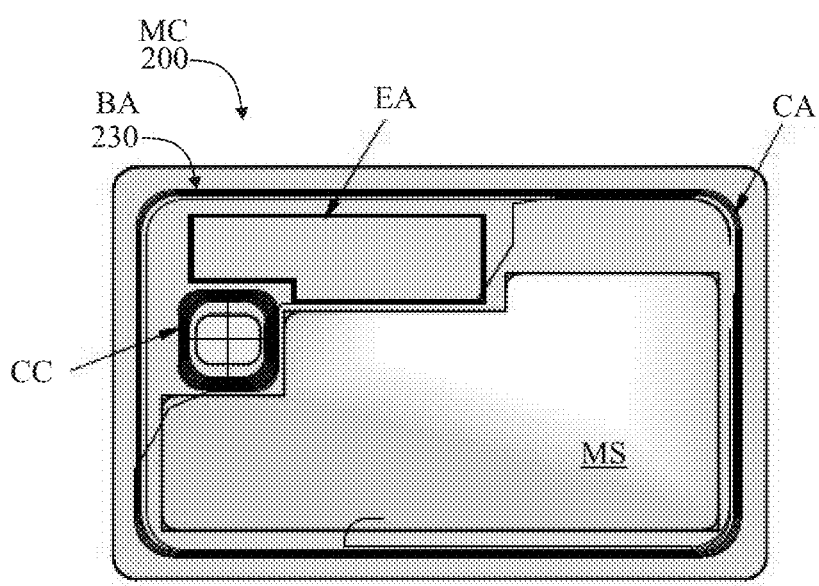

FIG. 2B is a front view of a dual-interface metal hybrid smartcard with sections removed from the metal slug to allow for non-shielding of the electromagnetic field around areas of the coupler coil (CC) and extension antenna (EA) of the booster antenna (BA).

Figure 2C:
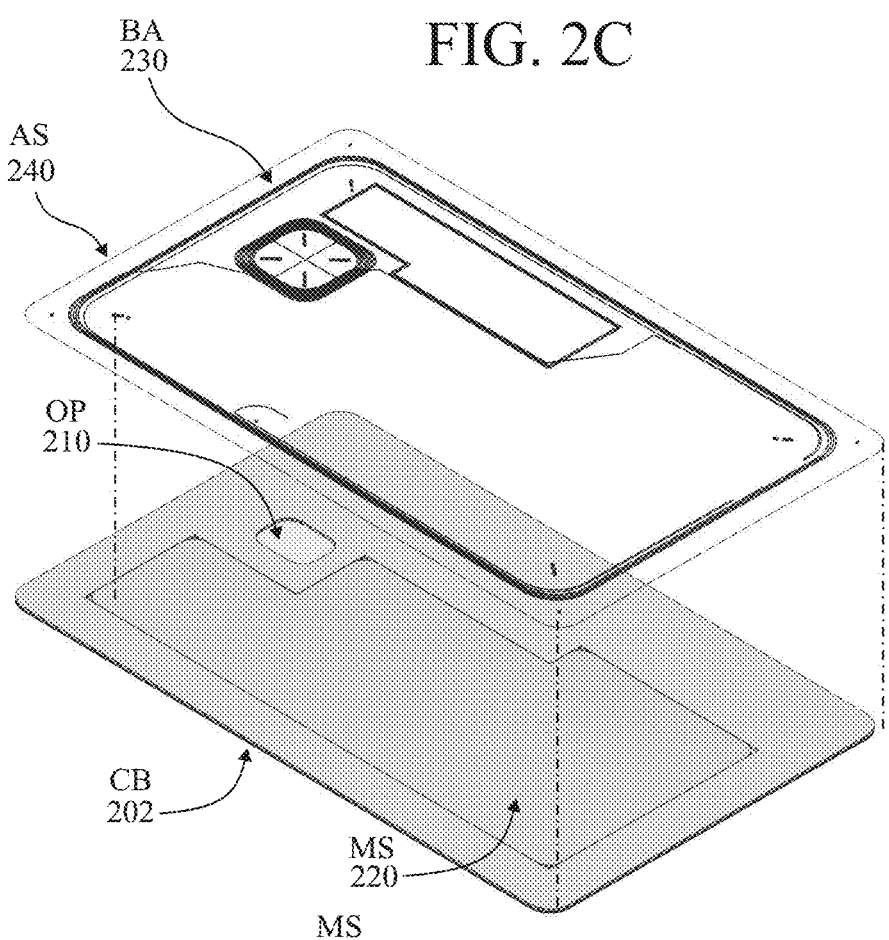

FIG. 2C is a perspective view of a dual-interface metal hybrid smartcard with a booster antenna (BA) compromising of a card body (CA) antenna routed around the perimeter of the metal slug, an extension antenna (EA) positioned outside the area of the metal slug and a coupler antenna (CC) for inductive coupling with the module antenna (MA) of the antenna module (AM).

Figure 2D:
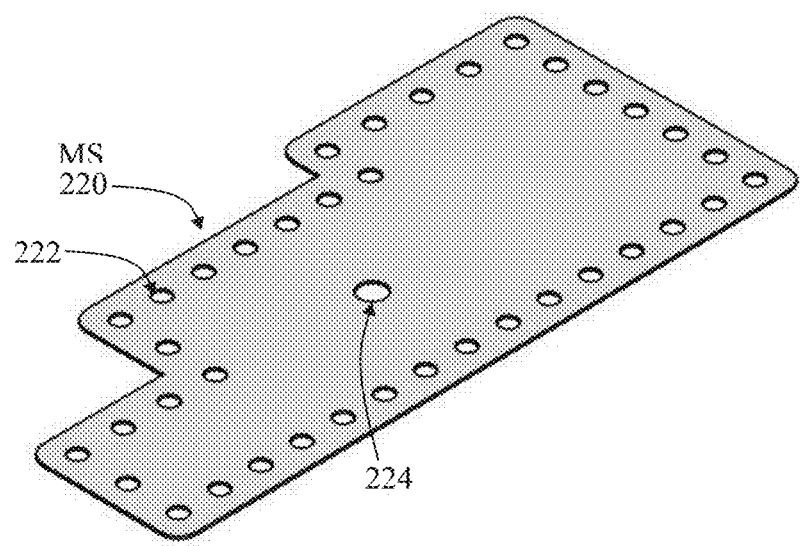

FIG. 2D is a perspective view of a metal slug with perforations and an opening for viewing an inductively coupled LED.

Figure 2E:
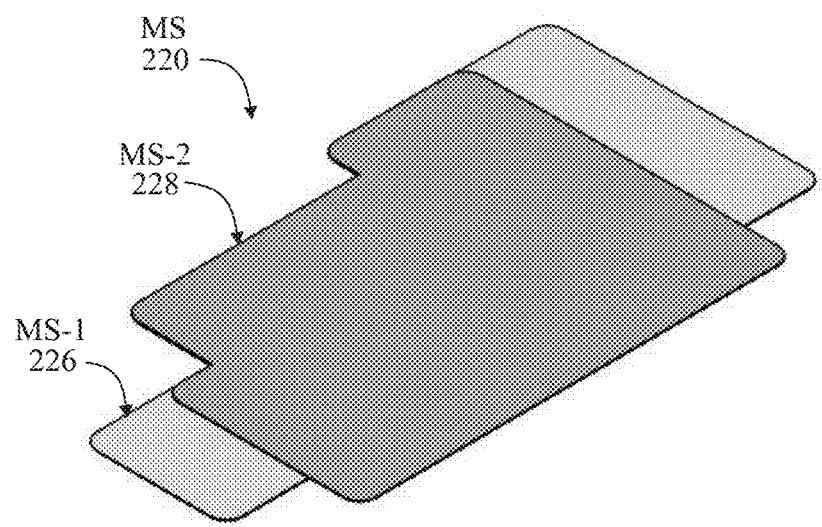

FIG. 2E is a perspective view of overlapping metal slugs having different overall dimensions.

Figure 2F:
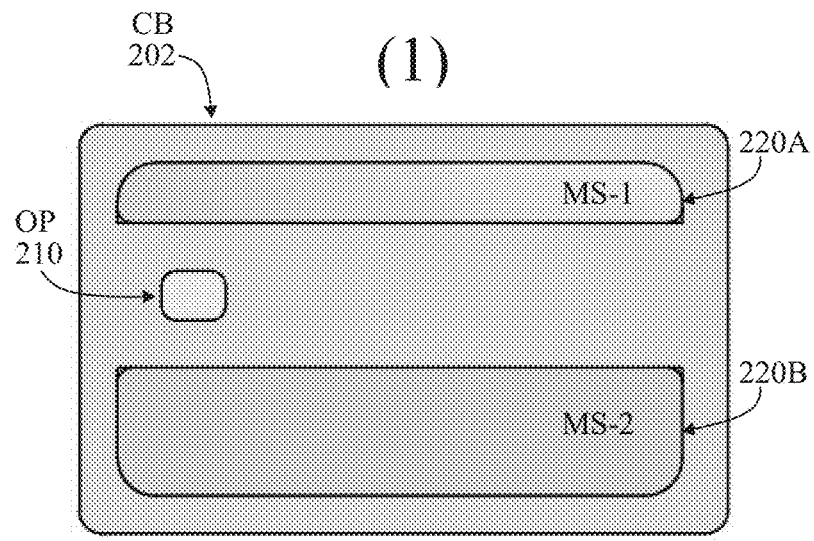
Figure 2F:
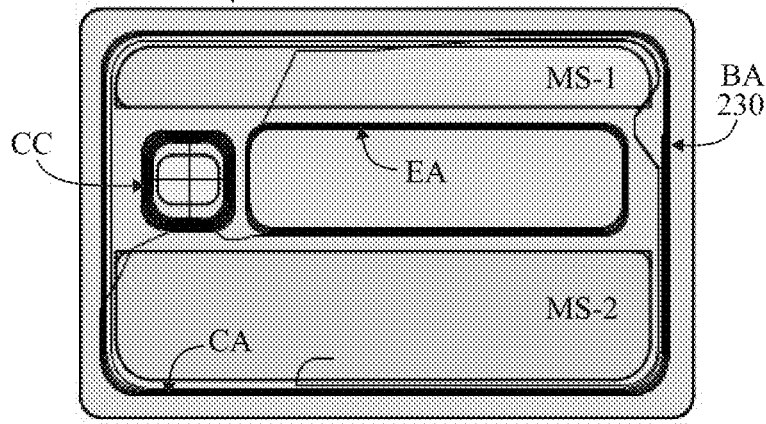

FIG. 2F is (two) front views labeled "(1)" and "(2)" of the front of a dual-interface smartcard with a booster antenna having metal slugs at those positions in which the various antenna components of the booster antenna are not present.

Figure 2G:
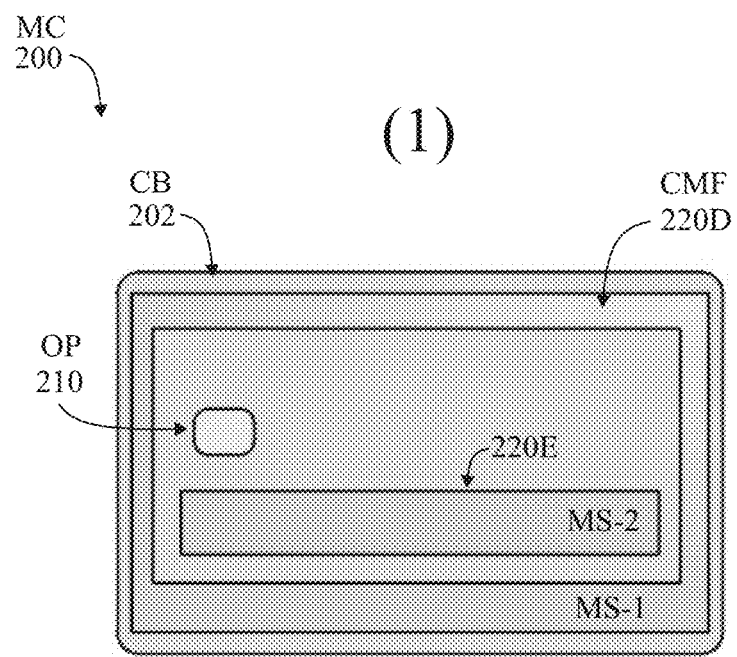
Figure 2G:
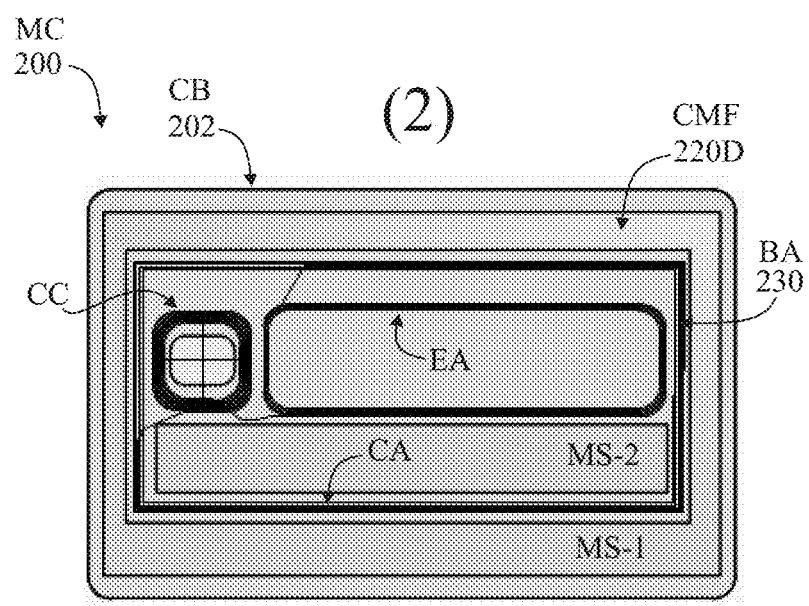

FIG. 2G is (two) front views labeled "(1)" and "(2)" of a dual-interface metal hybrid smartcard with a continuous metal frame (CMF) around the perimeter of the card body and the booster antenna inside the free space of the metal frame.

Figure 2H:
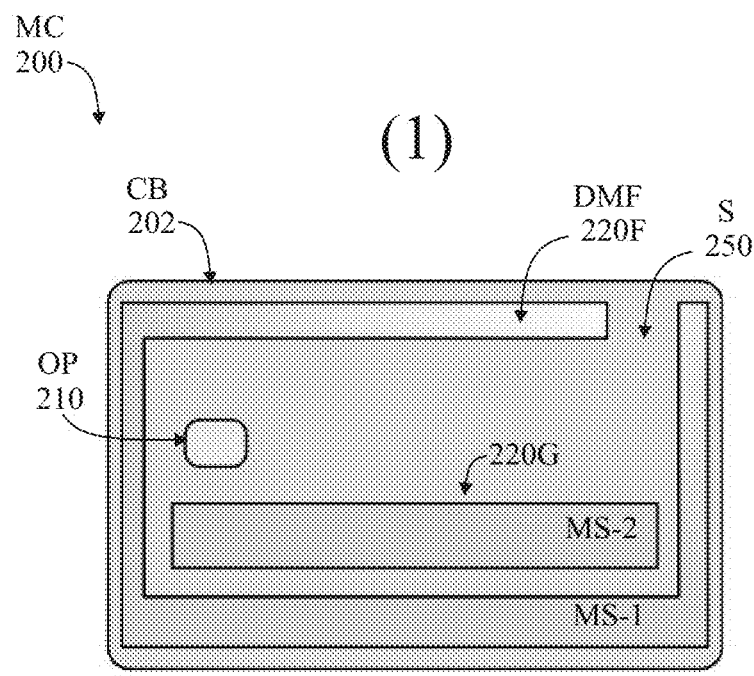
Figure 2H:
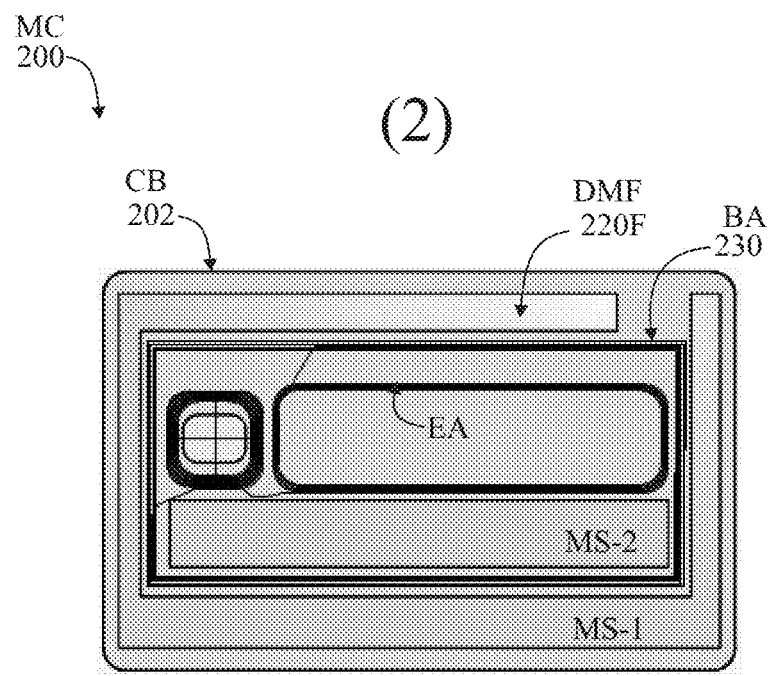

FIG. 2H is (two) front views labeled "(1)" and "(2)" of a dual-interface metal hybrid smartcard with a discontinuous metal frame (DMF) around the perimeter of the card body and the booster antenna inside the free space of the metal frame.

Figure 3:
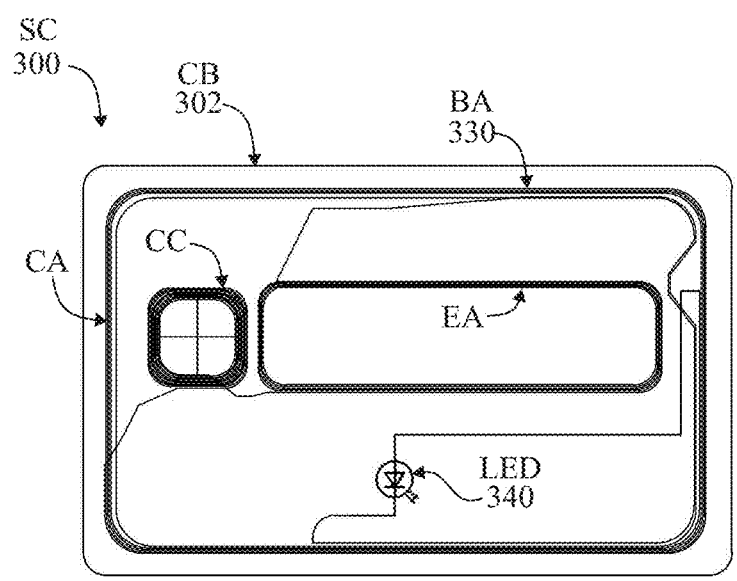

FIG. 3 is a booster antenna with its wire ends connected to an LED or any illuminating device without any physical connection to the chip module.

Figure 4A:
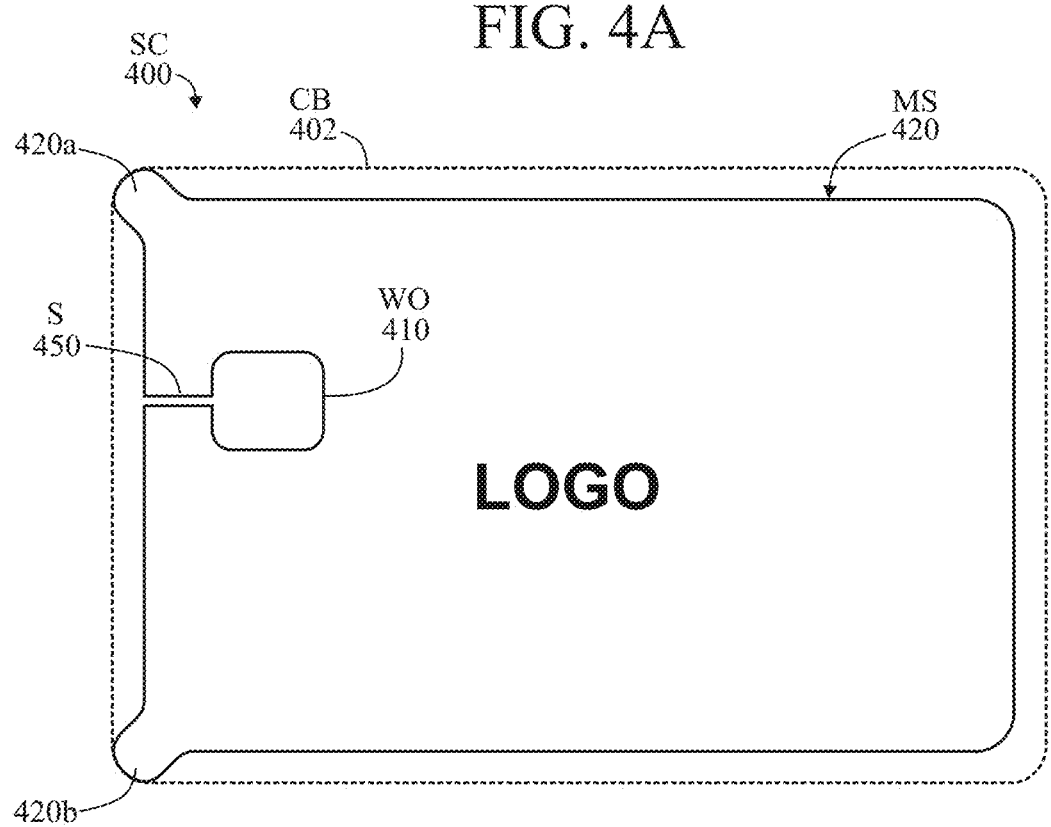

FIG. 4A illustrates a view of a modified slug with two protruding portions (arms or "ears") extending to the periphery of the card body (CB).

Figure 4B:
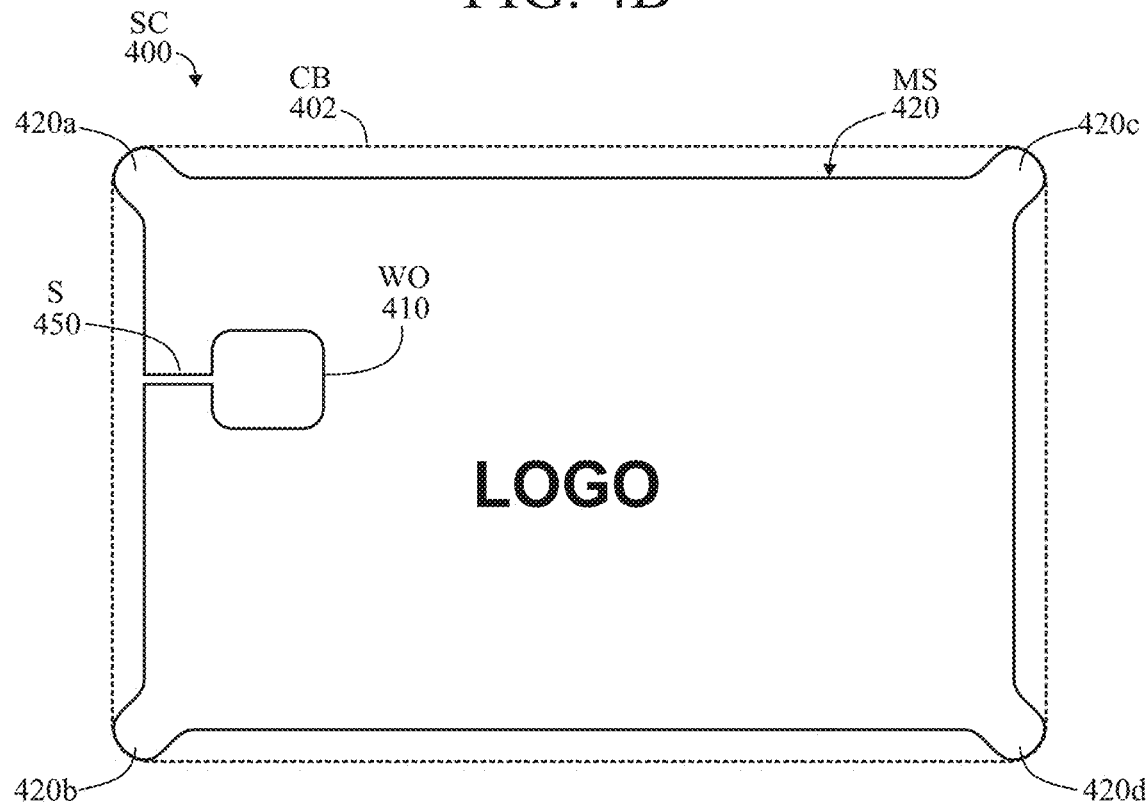

FIG. 4B illustrates a view of a modified slug with four protruding portions (arms or "ears") extending to the periphery of the card body (CB).

DETAILED DESCRIPTION

Various embodiments will be described to illustrate teachings of the invention(s), and should be construed as illustrative rather than limiting. It should be understood that it is not intended to limit the invention(s) to these particular embodiments. It should be understood that some individual features of various embodiments may be combined in different ways than shown, with one another. Reference herein to "one embodiment", "an embodiment", or similar formulations, may mean that a particular feature, structure, operation, or characteristic described in connection with the embodiment may be included in at least one embodiment of the present invention.

The embodiments and aspects thereof may be described and illustrated in conjunction with systems, devices and methods which are meant to be exemplary and illustrative, not limiting in scope. Specific configurations and details may be set forth in order to provide an understanding of the invention(s). However, it should be apparent to one skilled in the art that the invention(s) may be practiced without some of the specific details being presented herein. Furthermore, some well-known steps or components may be described only generally, or even omitted, for the sake of illustrative clarity.

Headings (typically underlined) may be provided as an aid to the reader, and should not be construed as limiting. Any dimensions and materials or processes set forth herein should be considered to be approximate and exemplary, unless otherwise indicated.

Reference may be made to disclosures of prior patents, publications and applications. Some text and drawings from those sources may be presented herein, but may be modified, edited or commented to blend more smoothly with the disclosure of the present application.

RFID cards, electronic tags and secure documents in the form of pure contactless cards, dual-interface cards, phone tags, key fobs, electronic passports, national identity cards and electronic driver licenses may be discussed as exemplary of various features and embodiments of the invention(s) disclosed herein.

In the main hereinafter, metal foil cards, metal composite cards, metal hybrid cards, non-continuous metal cards (cards having a metal element that has a discontinuity, as described herein), and solid metal cards with a plastic backing in the form of pure contactless cards, dual-interface cards and small form factor electronic tags may be discussed as exemplary of various features and embodiments of the invention(s) disclosed herein.

As will be evident, many features and embodiments may be applicable to (readily incorporated in) other forms of smartcards, such as EMV payment cards, payment objects, mobile phone tags, electronic keys and access control cards. As used herein, any one of the terms "transponder", "tag", "smartcard", "data carrier" and the like, may be interpreted to refer to any other of the devices similar thereto which operate under ISO 14443 or similar RFID standard. The following standards are incorporated in their entirety by reference herein:

ISO/IEC 14443 (Identification cards—Contactless integrated circuit cards—Proximity cards) is an international standard that defines proximity cards used for identification and the transmission protocols for communicating with it.

ISO/IEC 7816 is an international standard related to electronic identification cards with contacts, especially smartcards.

EMV standards define the interaction at the physical, electrical, data and application levels between IC cards and IC card processing devices for financial transactions. There are standards based on ISO/IEC 7816 for contact cards, and standards based on ISO/IEC 14443 for contactless cards.

A typical data carrier or transaction device (such as, but not limited to a smartcard) described herein may comprise
(i) an antenna module (AM) having an RFID chip (CM; or chip module) and a module antenna (MA) encompassing, a wire wound antenna, a laser etched antenna, a chemically etched antenna or a combination thereof, and components such as an LED, silicon capacitor or a layer of magnetic particles
(ii) a card body (CB) with a metal layer or layers on its front or back surface, or a metal layer or layers disposed inside its construction
(iii) a booster antenna (BA) with coupler coil (CC) and extension antenna (EA) disposed on the card body (CB) to enhance coupling between the module antenna (MA) and the antenna of an external RFID "reader".
(iv) an opening in the metal layer having a size slightly larger than the coupler coil (CC) of the booster antenna
(v) a carrier layer of selectively deposited magnetic particles or ferrite sheets placed on or around the area of the metal slug or slugs
(vi) a deposition of magnetic particles, a channel of magnetic particles or ferrite sheet cut-outs placed between the booster antenna (BA) and the metal slug or slugs.

When "chip module" is referred to herein, it should be taken to include "chip", and vice versa, unless explicitly otherwise stated. Chip or chip module may be referred to as "CM". Throughout the various embodiments disclosed herein, unless specifically noted otherwise (in other words, unless excluded), the element referred to as "CM" will most appropriately be a bare integrated circuit (IC) die (or RFID chip), rather than a chip module (a die with a carrier). In contrast therewith, some figures present examples that are specifically "chip modules" having IC chips (such as a "CM") mounted and connected to substrates. An antenna could also be formed on the silicon chip, see U.S. Pat. No. 6,373,447.

A smart card may comprise a chip module with a module antenna (MA) connected thereto, and may be referred to as an "antenna module" (AM), or as a "transponder chip module" (TCM"). The module antenna (MA) may comprise a coil of wire, conductive traces etched or printed on a module tape (MT) or antenna substrate (AS) for the antenna module (AM), or may be incorporated directly on the chip itself. A layer of magnetic particles may be incorporated into the antenna module (AM) to improve the communication performance The smart card may also have a booster antenna (BA) incorporated therein.

A smart card may comprise a chip module having contact pads for making contact (connections) with an external reader, such as according to ISO 7816, and may be referred to as a "contact module". When referred to as such, it is implied that there is no antenna, and the contact module is not capable of communicating with an external contactless reader, such as according to ISO 14443).

A smart card may comprise a dual-interface (DI) chip module which has both (i) contact pads for communicating with an external contact reader and (ii) an antenna for communicating with an external contactless reader.

Hybrid Cards

A hybrid card (or weighted transaction card) may comprise a plastic card with a metal slug. The metal slug may comprise (for example) tungsten slug, tungsten with a copper content or alloys of tungsten, and can be machined in such a way as to allow for a booster antenna with its various antenna components to be embedded into or onto an inlay substrate supporting the metal slug. The metal slug may also comprise stainless steel. The antenna structures can reside outside the area of the metal slug or partially overlap the area of the metal. The separation distance between the antenna wires of the booster antenna and the metal slug or slugs can be prepared with magnetic shielding material.

Various techniques may be used to incorporate a metal slug into a card body frame for the purpose of producing a weighted magnetic stripe card or a contact smartcard. The metal slug may typically have a thickness of approximately 300 µm and a weight of approximately 13 grams. The card body may have a thickness of approximately 0.78 mm (780 µm).

Techniques to incorporate a metal slug into an inductively coupled dual-interface smartcard or a capacitive coupling dual-interface smartcard may be hitherto unknown. This requires the integration of a booster antenna with its various antenna components with the metal slug that provides the additional weight. A metal slug in a card body has corners which can cause dents or blemishes in the printed graphics when the card is subject to torsion or bending. To offset the movement of the metal slug in the card body the metal slug can be sandblasted (or otherwise treated or prepared) to provide a rough surface finish for better adhesive adhesion to a thin carrier layer. The edges of the metal slug can be rounded (such as radiussed), if necessary, using suitable mechanical techniques (such as sanding, tumbling, etc.).

The thin carrier layer can be made of fleece, cotton, mesh, paper or synthetic material such PVC, PC, PET-G, Polyester or Teslin. The thin carrier layer may comprise magnetic particles incorporated into its structure or prepared with channels to accept magnetic particles, or may have magnetic particles on one or more of its surfaces.

The position (location) of the metal slug in a smartcard body may be below the magnetic stripe and several millimeters from the perimeter edge. Alternatively, the metal slug can be injected mold into an ABS core, or the metal slug resides in a recess or window in the layer which incorporates the booster antenna.

A modified metal slug with protruding arms or ears may extend to the corners of the card body (CB), covering an area underneath the magnetic stripe. The modified metal slug may comprise a non-continuous slab of metal with a slit or slot extending from the perimeter of the metal slug to the opening in the metal to accept an antenna chip module (AM) or transponder chip module (TCM). See FIGS. 4A, 4B.

The use of a metal slug in the construction of a DIF smartcard can shift the resonance frequency of a booster antenna with its various antenna components. For example, a booster antenna with a nominal resonance frequency of 9 MHz may resonate at 13.56 MHz when implemented in a smartcard bearing a slug made of, for instance, solid tungsten metal. The presence of the metal slug in the smartcard shifts the resonance frequency and/or changes power delivery to the chip.

In the case of certain metals or metal alloys there may be significant eddy currents in the slug which cancel out the RF carrier wave. Additional shielding from eddy current losses in the form of magnetic particles may be required. Magnetic particles may also be used to adjust the resonance frequency.

The magnetic particles may be located directly on the metal slug, being fixed in place by use of adhesive or may fill voids or cavities in the metal slug. The magnetic particles may be inserted into the smartcard attached to or embedded in a layer of plastic material such as PVC, PC, PET-G, Polyester or a material such as Teslin. The magnetic particles may also be deposited in around the periphery of the metal slug such that the area covered by magnetic particles overlaps the booster antenna or the magnetic particles may cover all of the area of the smartcard. The booster antenna may be kept at a distance from the metal slug and the separation distance may be filled or prepared with magnetic particles.

As disclosed herein, the metal plastic smartcard features a front metal plate bearing the credentials of the card holder (name, card serial number and expiry date). A surface finish on the metal plate may be a dielectric material such as a powder or a PVD (physical vapor deposition) coating. Alternatively, the metal may be laser engraved with patterns or logos or may be textured by use of a laser. The metal may be stamped or embossed.

The back side of the card may comprise a synthetic layer made of PVC, PC, PET-G, Teslin or any other synthetic material. This plastic layer may be attached to the front metal plate by an adhesive layer. The adhesive may be loaded with magnetic particles to offset the effects of shielding caused by the metal plate. The metal plate may be non-magnetic and a poor electrical conductor. The back side of the card may feature a metallic or metal foil finish. The back side of the card may be a composite material containing a re-enforcing filler of graphene, graphite, carbon fiber or carbon nanotubes. The purpose of the re-enforcing filler is to increase the Young's modulus and toughness of the plastic backing of the smartcard.

The antenna chip module (AM) may be inserted into a pocket (recess) on the plastic back side of the DIF smartcard or in a pocket formed in the re-enforced plastic layer. In addition, a recess on the reverse side or non-exposed side of the metal plate on the front side may be provided through milling or etching, having a shape and size similar to the module antenna of the antenna chip module. In this manner, a stepped cavity may be milled out in the plastic side of the DIF metal plastic hybrid smartcard to accommodate an antenna chip module. This cavity may be aligned with a cavity in the metal in order to accept the antenna chip module. The antenna chip module may be located on the same side of the DIF smartcard as other components traditionally found on the back side of smartcards such as the magnetic stripe, signature panel and hologram. Placing of the antenna chip module on this side of the smartcard enables easier manufacturing of the card and improves the RF communication of the smartcard with an RF reader when compared to placing the antenna chip module on the metal front side.

The objective of integrating an LED or a surface mounted LED into an inductively-coupled or capacitively-coupled dual-interface smartcard is to provide visual indication when the smartcard is in the near field range of a contactless reader or terminal, and to indicate the handshake of data communication between the smartcard and the reader. The LED is hardwire-connected to the wire ends of the booster antenna. The coupling coil of the booster antenna inductively couples with the antenna chip module. There is no physical connection between the various antenna components of the booster antenna and the antenna chip module. The booster antenna when loaded (presence of an antenna chip module) has a resonance frequency of approximately 11.8-13.56 MHz and the activation distance to trigger communication with the inductively coupled antenna chip module is approximately 4-6 cm. In unloaded mode (without the presence of an antenna chip module), the LED can be driven by the booster antenna when in the RF field of the reader. The illumination strength of the LED increases with proximity to the reader. The LED may blink or flicker at a frequency of 3 hertz when the RFID polling software of the reader interrogates the antenna chip module. The activation distance is marginally influenced by the loading of the LED. The AC voltage and current (power) generated by the booster antenna is sufficient to drive up to three LEDs. A resistor could be added to control the switch-on voltage of the LED relative to proximity with the reader. The LED can be used to protect the RFID silicon die in the antenna chip module from over-voltage from the inductive coupling with the booster antenna. The LED can be positioned in the card body, behind a hologram or underneath the antenna chip module. The LED can also be connected to the module antenna of the antenna chip module. Alternatively, an LED could be connected to across a slit in a discontinuous coupling frame (with slit) which is integrated into a smart card (SC) on the card body (CB) thereof, surrounding and closely adjacent to the antenna module (AM) or transponder chip module (TCM). The LED can be positioned in the card body, behind a hologram or underneath the antenna chip module.

an LED could be connected across a slit in a discontinuous coupling frame (with slit) which is integrated in the transponder chip module (TCM) on the module tape (MT) thereof, surrounding and closely adjacent the module antenna (MA).

an LED could be connected to ends of a module antenna (MA) inside an antenna module (AM).

an LED could be connected the slit a in the metal slugs disposed herein which function as coupling frames, surrounding and closely adjacent the antenna module (AM).

an LED may be connected to free ends of the booster antenna (BA). See FIG. 3

It is generally preferred that the inner edge (opening in the coupling frame) overlap at lease some of, including up to all of the turns of a module antenna (MA), particularly an etched (such as laser-etched) planar antenna on a module tape or other suitable substrate.

As used herein, "closely adjacent" may typically mean that the inner edge (IE) of the coupling frame (CF) is separated by only a small gap (such as less than 100 µm) from an outer turn of the module antenna (MA), which may generally be true when the coupling frame (CF) is on the same side of the module tape (MT) as the module antenna (MA), and "substantially coplanar" therewith. However, in some embodiments, the coupling frame (CF) may be on an opposite side of the module tape (MT) from the module antenna (MA), and an inner portion of the coupling frame (CF) may overlap (be above) at least an outer portion of the module antenna (MA). This latter situation (overlapping) is intended to be included in the definition of "closely adjacent", and in a definition of "substantially coplanar" therewith. Generally, more overlap of the coupling frame and module antenna may produce better results (improved coupling, leading to increased activation distance.)

As used herein, "partially surrounding" may typically mean that the inner edge (IE) of the coupling frame (CF) almost nearly encircles (except for the slit S) the module antenna (MA), which may generally be true when the coupling frame (CF) is on the same side of the module tape (MT) as the module antenna (MA), and substantially coplanar therewith. However, in some embodiments, the coupling frame(CF) may be on an opposite side of the module tape (MT) from the module antenna (MA), with an inner portion of the coupling frame (CF) overlapping (disposed above) at least an outer portion of the module antenna (MA), or even the entire module antenna (MA). This latter situation (overlapping) is intended to be included in the definition of "partially surrounding". Generally, more overlap of the coupling frame and module antenna may produce better results (improved coupling, leading to increased activation distance.)

The descriptions that follow may mostly be presented in the context of dual-interface (DI, DIF) metal hybrid smartcards, and may relate mostly to the contactless operation thereof. Many of the teachings set forth herein may be applicable to metal containing transaction cards, payment objects containing metal, small form factor tags and the like having only a contactless mode of operation (single interface). Generally, any dimensions set forth herein are approximate, and any materials set forth herein are intended to be exemplary, not limiting.

Dual-Interface Smartcards, Generally

A smartcard (as an example of a RFID device, such as secure document, a smartcard, an RFID tag, or a transponder device) may comprise an inlay substrate or card body (CB), an antenna module (AM), and a booster antenna (BA). The antenna module (AM) (or "antenna chip module", or sometimes "chip module") may comprise an RFID (radio frequency identification) chip or chip module (either of which may be referred to as "CM" or "IC") and a module antenna (MA). The RFID chip (CM, or IC) may be mounted on the "face down" or "chip side" or "bonding side" of a module tape. In the case of "dual-interface" (DI) cards, the "face up" or "contact side" of the antenna module (AM) may have a number such as 6 or 8 contact pads (CP) for interfacing with a contact reader in a contact mode (ISO 7816-2). The booster antenna (BA), typically comprising several windings of wire in the card body (CB) may comprise various "antenna components", such as a card body antenna (CA) component for coupling with an external contactless reader (ISO 14443) a coupling coil (CC) component for coupling with the module antenna (MA) of the antenna module (AM) and an extension antenna (EA) component for enhancing performance of the booster antenna (BA).

RFID cards, electronic tags and secure documents in the form of pure contactless cards, dual-interface cards, phone tags, key fobs, payment objects, wearable devices, and smart watches, may be discussed as exemplary of various features and embodiments of the invention(s) disclosed herein. As will be evident, many features and embodiments may be applicable to (readily incorporated in) other forms of smartcards, such as EMV payment cards, metal composite cards, metal hybrid cards, metal foil cards, access control cards, small form factor cards and secure credential documents. As used herein, any one of the terms "transponder", "tag", "smartcard", "data carrier" and the like, may be interpreted to refer to any other of the devices similar thereto which operate under ISO 14443 or similar RFID standard. The following standards are incorporated in their entirety by reference herein:

ISO/IEC 14443 (Identification cards—Contactless integrated circuit cards—Proximity cards) is an international standard that defines proximity cards used for identification, and the transmission protocols for communicating with it.

ISO/IEC 7816 is an international standard related to electronic identification cards with contacts, especially smartcards.

EMV standards define the interaction at the physical, electrical, data and application levels between IC cards and IC card processing devices for financial transactions. There are standards based on ISO/IEC 7816 for contact cards, and standards based on ISO/IEC 14443 for contactless cards.

The module antennas (MA) described herein may comprise one or more antenna structures (AS). A given antenna structure AS may comprise a coil of wire, conductive tracks (or traces) etched or printed on a module tape (MT), or may, in some cases, be incorporated directly on the RFID chip itself. A layer of magnetic particles may be incorporated into the antenna module (AM) to improve the communication performance between the module antenna (MA) of the antenna module (AM) and a booster antenna (BA) of an inlay substrate or an antenna of an external contactless reader. The layer or core of magnetic particles may act as a filter (suppressor).

The descriptions that follow are mostly in the context of dual-interface (DI, DIF) smartcards, and relate mostly to the contactless operation thereof. Many of the teachings set forth herein may be applicable to payment objects and the like having only a contactless mode of operation (single interface). Generally, any dimensions set forth herein are approximate, and any materials set forth herein are intended to be exemplary, not limiting. For example, copper may often be recited as an example of an electrically conductive material which may be used as a foil layer or a cladding layer (such as on the module tape MT).

Antenna Modules (AM), Generally

The antenna module (AM) may be quite small (having a punching size of 10.8 mm×8.2 mm for a 6 contact pad module from NXP or 11.0 mm×8.3 mm for a 6 contact pad module from Infineon, or 13.0 mm×11.8 mm for a 8 contact pad module from Infineon).

Reference is made to ISO 7816, incorporated by reference herein, and defines the dimensions of a card body CB within which the antenna module AM may be mounted. The dimensions of the card body CB, as defined by ISO 7816 are:

Width: 85.47 mm–85.72 mm
Height: 53.92 mm–54.03 mm
Thickness: 0.76 mm+0.08 mm

The module antenna (MA) of the antenna module (AM) is inductively coupled rather than electrically connected to a booster antenna (BA) which is typically disposed in the card body (CB). The booster antenna (BA) may comprise a card antenna (CA) portion (or component) disposed around the periphery of the card body (CB) and a coupler coil (CC) portion (or component) disposed at an interior area of the card body (CB) for inductively coupling with the module antenna (MA). The booster antenna (BA) may further comprise an extension antenna (EA) portion (component) to provide enhanced capacitance and resistance, and improve coupling. The terms card antenna (CA) and booster antenna (BA) may be used interchangeably herein.

The module antenna MA may be a wire-wound coil, or an etched spiral pattern of conductive tracks (or traces), separated by spaces. For an etched pattern, the RFID chip CM is typically disposed in the center of the spiral antenna pattern, making that space (under the RFID chip CM) unavailable for turns of the antenna. A significant amount of space around the chip CM is unavailable for the etched antenna. The antenna module AM may have 8 or 6 contact pads. Some dimensions (all approximate) for the module may be, The overall size of an 8-pad module may be W=13.0 mm×H=11.8 mm The overall size of a 6-pad module may be W=11.0 mm×H=8.4 mm The module antenna MA may have 12 "turns", or tracks.

Each track of the module antenna MA may have a width of 0.100 mm (100 μm)

A gap between adjacent tracks of the module antenna may be 0.100 mm (100 μm)

The "pitch" (width+gap) of the tracks may be 0.175 mm (0.1+0.075)

The RFID chip CM may measure approximately 2 mm×2 mm

The inner dimension of the module antenna MA may be approximately 9 mm×8 mm.

This is the area occupied by the RFID chip CM and its interconnections.

Because of the restrictions on the size of the smartcard module (e.g. approximately 13×12 mm, or 11×9 mm), the number of turns (or tracks) forming the module antenna MA is normally limited to the space surrounding the central position of the RFID chip (silicon die) which is attached and bonded to the module tape MT. This module tape MT is typically made of epoxy glass with a contact metallization layer on the face-up side and a bonding metallization layer on the face-down side of the module. The chemically etched antenna is usually formed on the face-down side.

FIG. 1 illustrates a dual-interface (DI) smartcard SC, along with a contact reader and a contactless reader. The smartcard may comprise a card body CB substrate which may have a recess R which may be milled out for accepting an antenna module AM. A booster antenna BA having at least a card antenna CA component and a coupler coil CC component may be disposed on a surface of the card body CB. The booster antenna BA may comprise turns (or traces, or tracks) of wire (or other conductor) embedded in (or disposed on) the card body CB. The antenna module AM may comprise a module tape MT. An RFID chip CM may be disposed on one side of the module tape MT along with a module antenna MA for inductively coupling with the booster antenna BA. Contact pads CP may be disposed on the other side of the module tape MT for interfacing with the external contact reader. The smartcard may interface with an external contactless reader using RF signals for exchanging data and for powering the RFID chip CM.

The booster antenna BA (and other features) disclosed herein may increase the effective operative ("reading") distance between the antenna module AM and the external contactless reader with capacitive and inductive coupling. With reading distances typically on the order of only a few centimeters, an increase of 1 cm can represent a significant improvement.

A passive transponder device comprising an RFID chip or die connected to an antenna may be incorporated as a chip module or antenna module AM in RFID devices such as smartcards, tags and security documents. The antenna (or module antenna "MA") can be wire wound, wire embedded, chemically etched (copper, silver, aluminum), sputtered and printed (conductive inks) on a variety of substrates. Such cards, tags and documents may comprise several substrate layers protecting the transponder device, and the layers may be laminated to form a composite product.

Booster antennas (BA) in the card body (CB) of a smartcard improve coupling between the antenna module (AM) with an external contactless reader, Several examples of booster antennas (BAs) are shown and described in the following applications or publications.

U.S. Ser. No. 13/600,140 filed 30 Aug. 2012 (U.S. Pat. No. 8,991,712)

U.S. Ser. No. 14/020,884 filed 8 Sep. 2013 (U.S. Pat. No. 9,033,250)

U.S. Ser. No. 14/173,815 filed 6 Feb. 2014 (U.S. Pat. No. 9,195,932)

Generally, a booster antenna BA may comprise a single length of wire, having two free ends "a" and "f", mounted to (or embedded in) a surface of a synthetic substrate (or card body CB), and may comprise a card antenna CA component disposed around the periphery of the card body CB, a coupler coil CC component disposed at an interior area of the card body CB at a location corresponding to the location of an antenna module AM, and an extension antenna EA disposed at an upper portion of the card body CB.

Each of the booster antenna components (CA, CC, EA) may comprise several turns (or tracks) of wire which may be laid in a clockwise CW direction (with a first "sense") or in a counter-clockwise CCW direction (with an opposite "sense"). The pitch of the turns may be different for each of the booster antenna components (CA, CC, EA). The turns of a given booster antenna component (CA, CC, EA) may be organized into a number of turns comprising an inner winding (IW, iw) and a number of turns comprising an outer winding (OW, ow) disposed around the inner windings of the component. The laying of the various booster antenna components (CA, CC, EA) may involve wire crossing over previously laid components, or portions thereof.

FIG. 1A shows an exemplary booster antenna BA comprising a card antenna CA component, a coupler coil CC component and an extension antenna EA component. The overall booster antenna BA may have two free ends "a" and "f", and may be formed by embedding wire in an inlay substrate (or card body), such as in the following illustrative steps "1" to "5":

1. starting at the free end "a" of the card antenna CA component, laying the wire for the outer winding OW, in a clockwise CW direction, from an innermost turn to an outermost turn thereof, around (just within) the periphery of the card body CB (not shown),
2. then, crossing over the already laid turns of the outer winding OW of the card antenna CA component, heading towards the interior of the card body CB and commencing laying the wire for the coupler coil CC component, in a counter-clockwise CCW direction, from an outermost turn to an innermost turn thereof,
3. then, crossing over the already laid turns of the coupler coil CC component, commencing laying the wire for the extension antenna EA component, in a counter-clockwise CCW direction, from an outermost turn to an innermost turn thereof,
4. then, crossing over the already-laid turns of the extension antenna EA component, heading back towards the periphery of the card body CB and commencing winding the inner winding IW of the card antenna CA component in a clockwise CW direction, from an innermost turn to an outermost turn thereof, within the already laid outer winding OW,
5. finishing laying of the wire for the booster antenna BA at the free end "f", which may be (but need not be) close to the other free end "a".

A Weighted Transaction Card

US 20140021261 (U.S. Pat. No. 8,857,722, Mosteller, 2014), incorporated by reference herein, may be representative of some prior art for weighted transaction cards. Of particular interest may be FIGS. 1 and 2, 10, 11, 16, therein, wherein FIG. 1 depicts an embodiment of a tungsten member as disposed in an opening of a surround.

FIG. 2 depicts an embodiment wherein the tungsten member may be secured with respect to the surround by way of an encapsulant.

FIG. 10 depicts an embodiment of a tungsten member disposed in a surround, where the tungsten member has a relief portion and the surround has a corresponding projection.

FIG. 11 depicts the embodiment of FIG. 10, with a milled pocket provided in the surround for receipt of a device.

FIG. 16 depicts the placement of a tungsten member relative to a machine readable indicia in an embodiment of a transaction card.

The dimensions of the slug may be chosen such that the slug sits some minimum distance, such as 6.35 mm away from the edges of the card in order to leave the card edges composed of plastic (PVC), such as on at least three sides/edges thereof (such as left, right, bottom). A greater clearance, such as 13.9 mm may be provided between the metal slug and top edge of the card. The front and back faces of the smartcard may comprise layers of plastic, resin or polymer as per a normal smartcard. The plastic material surrounding (enclosing) the metal slug may have an overall thickness chosen to compensate for the thickness of the metal slug and any adhesive/resin layers used to fix the metal slug within the body of the metal hybrid smartcard. Thus, this layer of plastic material may be referred to herein as the "compensation layer". This construction mitigates problems with electrostatic discharge (ESD) that can result from the use of metal in the smartcard. The density of the metal slug and size of the slug may be chosen to achieve the required total mass of the card (e.g. 15 grams). Refer, for example, to FIGS. 1 and 2 of US 20140021261.

The metal hybrid smartcard may be provided with a recess or an opening to accept a contact module. An opening to accept a 6-contact module (opening 11.2 mm×8.6 mm) may be provided shown. Refer to FIG. 10 of US 20140021261.

The 6-contact module may have a punched size 11.0 mm×8.4 mm, and may be disposed within an opening of 11.2 mm×8.6 mm. Refer to FIG. 11 of US 20140021261.

A magnetic stripe panel may be disposed on the plastic region at the top of the metal hybrid smartcard above the metal slug. Refer to FIG. 16 of US 20140021261.

The smartcards described in US 20140021261 may incorporate contact modules in the card body for implementing a contact interface with an external contact reader, and are not equipped (i.e., with an antenna) for implementing a contactless interface with an external contactless reader.

An Exemplary Booster Antenna (BA)

FIG. 1A shows an exemplary layout for a booster antenna (BA) in a smartcard (SC) having a card body (CB). The booster antenna may be formed by embedding wire in the card body or in a separate substrate. The wire may be embedded or scribed into the substrate using a sonotrode (ultrasonic tool) and electrically connected with the chip module (CM). See, for example U.S. Pat. Nos. 6,698,089 and 6,233,818, incorporated by reference herein. The booster antenna may have two ends (a) and (f), and may comprise the following components, interconnected and disposed in the card body (CB) as shown in the figure, more particularly:

a card antenna (CA) component may have several turns and may be disposed around a peripheral area of the card body (CB). The card antenna (CA) component may comprise an inner winding (IW) and an outer winding (OW). A typical pattern for a card antenna (CA) is generally rectangular, in the form of a flat (planar) coil (spiral) having a number of turns, disposed around the periphery of the substrate (or relevant portion thereof). See, for example, U.S. Pat. No. 7,980,477.

the outer winding (OW) of the card antenna (CA) component may have an inner end (a) which is a free end, and may be laid in a clockwise (CE) direction, a few turns, until it reaches its outer end, whereat the antenna wire crosses over the already laid winding of the outer winding (OW)

a coupler coil (CC) component may have several turns and may be disposed at an interior location of the card body (CB) corresponding with a location which is typically milled out to accept an antenna module (AM) having a module antenna (MA) or a transponder chip module (TCM) having a planar antenna (PA). The coupler coil (CC) component may have an outer winding (ow) and an inner winding (iw).

the inner winding (iw) may have several turns and may be laid in a counter clockwise (CCW) direction for a few turns, until it reaches a point whereat it crosses over the already laid inner winding (iw) to the outer end (oe) of the extension antenna (EA) component.

the extension antenna (EA) component may be laid in a counter clockwise (CCW) direction for a few turns, until it reaches a point which is the outer end (oe) of the outer winding (ow) of the coupler coil (CC) component.

the outer winding (ow) of the coupler coil component may be laid in a counter clockwise (CCW) direction for a few turns until it reaches its inner end (ie) at a point whereat it crosses over the already laid outer winding of the coupler coil (CC) component to the inner end (e) of the inner winding (IW) of the card antenna (CA) component the inner winding (IW) may be laid in a clockwise direction (CW) for a few turns, from innermost turn to outermost turn where it ends at a point (f) near the inner end (a) of the outer winding (OW) of the card antenna (CA) component.

the extension antenna (EA) component may have several turns and may be disposed at an interior location of the card body (CB), such as in the top half of the card body (CB), and some of the turns of the extension antenna (EA) may surround the coupler coil (CC).

The booster antenna (BA) shown in FIG. 1A is merely exemplary. Other configurations of booster antennas that may be suitable for incorporating into the smart cards described herein are disclosed in US 20150021402 and US 20130075477, for example. These booster antennas generally all have in common the card antenna (CA) component disposed around a peripheral area of the card body (CB), the coupler coil (CC) component disposed at an interior area of the card body (CB) at, under or around an opening in the card body (CB) intended for receiving the antenna module (AM), and may also have extension antenna (EA) components.

U.S. Ser. No. 14/020,884 (U.S. Pat. No. 9,033,250) discloses a booster antenna (BA) for a smart card comprises a card antenna (CA) component extending around a periphery of a card body (CB), a coupler coil (CC) component at a location for an antenna module (AM), and an extension antenna (EA) contributing to the inductance of the booster antenna (BA). A method of wire embedding is also disclosed, by controlling a force and ultrasonic power applied by an embedding tool at different positions on the card body (CB).

FIG. 1B (compare FIG. 1A of Ser. No. 14/020,884) shows a card body (CB) 120 has a surface with an overall surface area, such as approximately 54 mm×86 mm~=4600 mm2. An upper portion 120a of the card body CB may constitute approximately half (such as 50-70%) of the overall surface area of the card body CB, and a lower portion 120b of the card body CB may constitute a remaining approximately half (such as 30-50%) of the overall surface area of the card body CB.

A "peripheral" area 142 of the surface of the card body CB extends around the periphery of the card body CB in at least the upper portion 120a thereof, and may have a width of up to approximately 5 mm. The card antenna CA component (or, peripheral component of the booster antenna) may be disposed in this first area. The width of the first, peripheral area 142 may be greatest at the top edge of the card body CB, of medium width at the side edges of the card body CB, and least at the bottom edge of the card body CB.

A "coupling" area 144 of the surface of the card body CB is located in an interior area (within the peripheral area 142) of the card body CB, in the upper portion 120a thereof, at a position corresponding to the location of the antenna module AM, and may be of approximately the same size as the antenna module AM, such as approximately 8.2 mm×10.8 mm for a 6-contact module and 11.8 mm×13 mm for an 8-contact module.

An "embossing" area 146 of the surface of the card body CB is located in an interior area (within the peripheral area 142) of the card body CB, in the lower portion 120b thereof, is separate from the peripheral area 142 and the coupling area 144, and may constitute most (such as 80-90%) of the lower portion 120b of the card body CB.

A "remaining" (or "residual") area 148 of the surface of the card body CB is located in an interior area (within the peripheral area 142) of the card body CB, in the upper portion 120a thereof, is separate from the peripheral area 142 and the coupling area 144, and may constitute most (such as 60-80%) of the upper portion 120b of the card body CB. The card antenna 132 and coupler coil 134 are not disposed in this remaining area 148—in other words, are disposed substantially entirely in areas (142, 144) other than the remaining area 148 (and other than the embossing area 146).

An additional booster antenna component, referred to herein as an antenna extension (EA) component, may be disposed in remaining (or residual) area 148 of the surface of the card body CB. The antenna extension EA may comprise several turns (or traces) of wire (or other conductive material), and may be either (i) connected with one or both of the card antenna CA and coupler coil CC or (ii) not connected with either of the card antenna CA and coupler coil CC.

FIG. 1C (compare FIG. 3B of Ser. No. 14/020,884) expands upon FIG. 1B and illustrates, schematically and generally, the addition (inclusion) of an extension antenna (EA) component of a booster antenna BA disposed in the residual area (148) of a smart card. The extension antenna (EA) is shown only generally in this figure, it is shown in greater detail in other figures in U.S. Ser. No. 14/020,884.

Some Embodiments of the Invention

FIGS. 2A-2H may be representative of some embodiments of the invention(s) disclosed herein, wherein a smart-card (or the like) comprises a plastic card body (CB) 202 having an opening (OP) 210 or recess to accept an antenna module (AM), more particularly to allow space for the module antenna (MA) of an antenna module (AM) or transponder chip module (TCM) to be disposed in the opening. Generally, the antenna module (AM) may be omitted from these figures, for illustrative clarity. A metal slug (MS) 220 may be disposed in the card body (CB), and may be formed of a metal such as tungsten or alloys of tungsten, and may be nearly as thick as the card body (CB), and may occupy at least 50% of the overall area of the card body (CB). A booster antenna (BA) 230 may be disposed in the card body (CB), and may have a peripheral card antenna (CA) component disposed around the periphery of the card body (CB), a coupler coil (CC) component disposed around the opening (OP) for the antenna module (AM) and, optionally, an extension antenna (EA) component disposed at an interior area of the card body (CB). The metal slug (MS) may be machined, (or otherwise formed) in such a way as to allow for (i.e., not interfere with) the insertion or placement of the antenna module (AM) into the card body (CB), and also for the insertion or placement of a booster antenna (BA) into the card body (CB).

A smartcard capable of interacting with a contact reader and also with a contactless reader (see FIG. 1) may be referred to as a "dual-interface" smartcard.

A smartcard having a substantial metal slug incorporated into its card body may be referred to as a "metal hybrid" smart card. The metal slug may comprise tungsten, alloys thereof, and other metals.

FIG. 2A is front view of an exemplary plastic card body (CB) or the inlay core of a plastic card body with a metal slug (MS) disposed therein. The shape of the metal slug (MS) may be such that positions are available in the card body to allow for a booster antenna (BA) with its various antenna components (CA, CC, EA) to be inserted, placed, printed, deposited or embedded in or on the non-metal areas. In this example, the metal slug (MS) extends:

nearly entirely across a bottom portion of the card body (CB), from near the bottom edge of the card body nearly to the opening (OP) for the antenna module (AM), then further upward towards the top edge of the card body (CB), while avoiding the opening (OP) and allowing space around the opening for a coupler coil (CC) component of a booster antenna (BA) to be disposed in the card body (CB) around the opening (OP), then the metal slug (MS) may extend further upward, towards the top edge of the card body (CB), while allowing space for an extension antenna (EA) component of the booster antenna (BA) to be disposed in the card body (CB).

the metal slug (MS) may not encroach on an outer, peripheral portion of the card body (CB) whereat the card antenna (CA) component of the booster antenna (BA) may be disposed in the card body (CB). In such instances, the card antenna (CA) component is disposed outside of the metal slug (MS). In some embodiments disclosed herein (such as shown in FIGS. 2G, 2H, a portion of the metal slug, or one of two metal slugs may extend as a frame around the periphery of the card body, with the card antenna component of the booster antenna disposed within the frame.)

In FIGS. 2A, 2B, 2C the metal slug (MS) occupies a substantial portion of the lower half of the card body, leaving most of the top half of the card body free from metal.

the metal slug does not encroach on a peripheral area of the card body (CB) which will be occupied by the card antenna (CA) component of a booster antenna (BA)

the metal slug is spaced a few millimeters from the opening for the antenna module, (AM), allowing space for the coupler coil (CC) component to be disposed under or surrounding the module antenna (MA) of the antenna module (AM)

the metal slug is shaped to leave a substantial portion of the top half of the card body (CB) free of metal (i.e., remaining as plastic) for placement of the extension antenna (EA) component.

The metal slug (MS) may have a surface area which is at least 50% (such as between 50% and 80%) of the overall surface area of the card body (CB). The booster antenna (BA) with its various components (CA, CC, EA) may occupy a relatively small portion (such as less than 10$) of the overall surface of the card body (CB) and may be disposed entirely in an area of the card body (CB) which is not occupied by the metal slug (MS).

FIG. 2B is a front view of a dual-interface metal hybrid smartcard with sections removed from the metal slug or metal layers to allow for non-shielding of the electromagnetic field around areas of the coupler coil (CC) and extension antenna (EA) of the booster antenna (BA). The card antenna (CA) component of the booster antenna (BA) is routed around the perimeter of the card body.

The booster antennas discussed herein may be the booster antennas shown herein (such as at FIG. 1A), or shown in some of Applicant's earlier applications (such as US 20130075477 which are mentioned herein (such as for claiming filing date benefit), or may be booster antennas of others, such as the coupling device shown in U.S. Pat. No. 8,130,166 (Ayala et al.).

FIG. 2C is an exploded perspective view of a dual-interface metal hybrid smartcard 200 with a booster antenna (BA) comprising a card body (CA) antenna component routed around the perimeter of the metal slug or metal layers, an extension antenna (EA) component positioned outside the area of the metal slug or metal layers, and a coupler antenna (CC) component for inductive coupling with a module antenna (MA) of an antenna module (AM). The booster antenna (BA) may be embedded directly into the card body (CB), around the metal slug (MS). Alternatively, as illustrated in FIG. 2C, the booster antenna (BA) may be first formed on a separate antenna substrate (AS) 240 which is later joined (such as laminated) to the card body (with metal slug).

FIG. 2D is a perspective view of an embodiment of a metal slug (MS) similar to the metal slug (MS) described with respect to FIG. 2A,B,C. The metal slug (MS) is shaped to accommodate a booster antenna (MA) and its various components (CA, CC, EA) being disposed in the card body (CB). The metal slug (MS) may be provided with perforations 222 around its periphery (peripheral area), and may also be provided with an opening 224 at an interior area thereof (such as approximately at the center of the metal slug) for accommodating an LED (not shown, see FIG. 3). The LED may be connected to the booster antenna (BA) so as to be inductively coupled with an external reader, and may include voltage regulation, a flip-flop or the like so that it blinks to indicate an in-progress contactless transaction. The card body (CB) and booster antenna (BA) are not shown in FIG. 2D, for illustrative clarity, these elements having adequately been shown in figures describing other embodiments and variations of smart cards having metal slugs and booster antennas.

Some Variations on the Metal Slug

FIG. 2E shows that a composite metal slug (MS) 220 may comprise two or more individual metal slug components (or simply "components"), for example:

a first component (MS-1) comprising a first layer 226 of a metal material such as tungsten, and a second component (MS-2) comprising a second layer 228 of a shielding material such as ferrite, or other magnetic particles.

The first and second layers (or metal slug components) may overlap each other and may have different shapes (or profiles) and different dimensions than one another.

FIG. 2F shows two views (1) and (2) of a metal hybrid dual-interface smartcard (MC) 200 having a metal slug comprising two components: a first metal slug component (MS-1) 220A and a second partial metal slug component (MS-2) 220B. The two metal slug components (MS-1, MS-2) are disposed at different positions in the card body (CB) 202, at positions in the card body (CB) in which the various antenna components of the booster antenna (BA) are not present, and they may not be overlapping one another. (The metal slug components may be incorporated into the card body at positions of the card body which are free from, or not occupied by, booster antenna components. View (1) is a front view of the metal slugs (MS-1, MS-2) disposed in the card body (CB), without the booster antenna (BA) in place, for illustrative clarity. View (2) is a front view of the metal slugs (MS-1, MS-2) disposed in the card body (CB), with the booster antenna (BA) in place, showing that the metal slugs (MS-1, MS-2) may be have shapes and be disposed at locations in the card body (CB) to allow for installing a booster antenna (BA) in areas of the card body (CB) which are not occupied by the metal slugs (MS-1, MS-2). An opening (OP) for accepting the antenna module (AM, not shown) is shown in the card body (CB). More particularly, in this example, the booster antenna (BA) has a card antenna (CA) component extending around a periphery of the card body (CB), a coupler coil (CC) component disposed at a location for the antenna module (AM), and an extension antenna (EA) component disposed across a middle portion of the card body (CB) extending across the card body (CB) from the coupler coil (CC) component towards an inner edge (or winding) of the card antenna (CA) component.

the first metal slug (MS-1) may be generally rectangular and may be disposed at an upper portion of the card body (CB), inside of the upper portion of the card antenna (CA) component, and down to the top edge of the extension antenna (EA) component. The first metal slug (MS-1) may extend substantially all the way across the card body (CB), occupying approximately 20% of the area of the card body (CB).

the second metal slug (MS-2) may be generally rectangular and may be disposed at a lower portion of the card body (CB), inside of the lower portion of the card antenna (CA) component, and up to the bottom edge of the extension antenna (EA) component. The second metal slug (MS-2) may extend substantially all the way across the card body (CB), occupying approximately 40% of the area of the card body (CB).

FIGS. 2G and 2H show some other embodiments of a metal slug (MS) having two components (MS-1, MS-2). In both examples, a first metal slug component (MS-1) may be disposed around a periphery of the card body, outside of the card antenna (CA) component of the booster antenna (BA), and a second metal slug component (MS-2) may be disposed at an interior location of the card body (CB).

FIG. 2G shows two views (1) and 2) of a metal hybrid dual-interface smartcard (MC) 200 having two metal slug components (MS-1, MS-2) 220D, 220E at positions in the card body in which the various antenna components of the booster antenna (BA) are not present. View (1) is a front view of the metal slug components (MS-1, MS-2) disposed in the card body (CB), without the booster antenna (BA) in place, for illustrative clarity. View (2) is a front view of the metal slug components (MS-1, MS-2) disposed in the card body (CB), with the booster antenna (BA) in place, showing that the metal slug components (MS-1, MS-2) may be have shapes and be disposed at locations in the card body (CB) to allow for installing a booster antenna in areas of the card body (CB) 202 not occupied by the metal slug components (MS-1, MS-2). More particularly,

- in this example, the booster antenna (BA) has a card antenna (CA) component extending around a periphery of the card body (CB), a coupler coil (CC) component disposed at a location for the antenna module (AM), and an extension antenna (EA) component disposed across a middle portion of the card body (CB) extending across the card body (CB) from the coupler coil (CC) component towards an inner edge (or winding) of the card antenna (CA) component.
- the first metal slug component (MS-1) 220D may be in the form of a rectangular metal frame disposed around (external to) the card antenna (CA) component of the booster antenna (BA). The first metal slug component (MS-1) may extend substantially all the way around the periphery of the card body (CB) in a continuous manner, forming a continuous metal frame (CMF) around the booster antenna (BA), and may occupy approximately 25% of the area of the card body (CB).
- the second metal slug component (MS-2) 220E may be generally rectangular and may be disposed at a lower portion of the card body (CB), inside of the lower portion of the card antenna (CA) component, and up to the bottom edge of the extension antenna (EA) component. The second metal slug component (MS-2) may extend substantially all the way across the card body (CB), occupying approximately 20% of the area of the card body (CB).

In this manner, a metal hybrid dual-interface smartcard may be provided with a "closed loop" metal frame (MF-1) extending around the perimeter of the card body and the booster antenna (BA) inside the free space of the metal frame. The metal frame would be used instead of a plug. The metal frame (MF-1) extending around the perimeter (periphery) of the card body may function in a manner similar to the compensation loop shown in FIG. 4B of US 20130126622. As disclosed therein, the compensation loop CL may comprise ferrite material, in which case since ferrite is not an electrical conductor (in contrast with copper) the loop may be closed, having no gap and no free ends. The compensation loop may be referred to as a "frame". The compensation frame on the reverse side of the booster antenna BA may help with the stabilization of the resonance frequency. The compensation loop CL may be used in addition to the booster antenna BA. The booster antenna BA may be embedded into one side of an inlay substrate while the compensation frame may be inkjet printed or adhesively attached to the opposite side of the inlay substrate. The compensation loop CL can be mounted using a subtractive (etching away of material) or additive (depositing material) process.

The continuous metal frame (CMF, MS-1) of FIG. 2G is a "closed loop", which can impair the electromagnetic field interacting with the booster antenna (BA), notably the card antenna (CA) component thereof. And, some comparisons may be made between this closed loop metal slug component which is a frame around the booster antenna (BA) with the compensation loop shown and described with respect to FIG. 4B of US 20130126622. wherein:

- the compensation loop CL may comprise ferrite material, in which case since ferrite is not an electrical conductor (in contrast with copper) the loop may be closed, having no gap and no free ends.
- The compensation loop may be referred to as a "frame". The compensation frame on the reverse side of the booster antenna BA (FIG. 1) may help with the stabilization of the resonance frequency.
- The compensation loop CL may be used in addition to the booster antenna BA. The booster antenna BA may be embedded into one side of an inlay substrate while the compensation frame may be inkjet printed or adhesively attached to the opposite side of the inlay substrate. The compensation loop CL can be mounted using a subtractive (etching away of material) or additive (depositing material) process.

FIG. 2H shows a metal hybrid dual-interface smartcard (MC) 200 with a metal slug component (MS-1) 220F (contrast 220D) which forms an "open loop" discontinuous metal frame (DMF) extending substantially fully, but not completely, around the perimeter of the card body (CB), with the booster antenna (BA) disposed inside the free space of the metal frame. There is a gap (G) or slit (S) 250 in the frame (MS-1), extending from an inner edge of the frame to an outer edge thereof, so it is not a "closed loop". Insulating layers (not shown), such as dielectric material or a layer of plastic may be disposed on at least one side of the metal frame, covering or filling the slit, and may comprise a dielectric medium such as an oxide layer. The frame may be covered on at least one side thereof with a layer of plastic over (and/or under) the slit (S). The slit (S) is shown at a corner of the frame (MS-1), but may be located at any suitable position along the extent of the frame, extending from an inner edge of the frame to the outer edge thereof. (See, for example, FIG. 4A where a slit extends from an opening in (or inner edge of) a slug to the outer edge thereof, at the "9 o'clock" position.) The slit may extend across a side of the frame, a corner of the frame, etc. There may also be two slits, separating the frame into two pieces.

A second metal slug component (MS-2) 220G (compare 220E) may be disposed internal to the booster antenna (BA), in a manner similar to the second metal slug component (MS-2) of FIG. 2G. The two metal slug components (MS-1, MS-2) are disposed at positions in the card body in which the various antenna components of the booster antenna (BA) are not present. View (1) is a front view of the metal slug components (MS-1, MS-2) disposed in the card body (CB), without the booster antenna (BA) in place, for illustrative clarity. View (2) is a front view of the metal slug components (MS-1, MS-2) disposed in the card body (CB), with the booster antenna (BA) in place, showing that the metal slug components (MS-1, MS-2) may be have shapes and be disposed at locations in the card body (CB) to allow for installing a booster antenna in areas of the card body (CB) not occupied by the metal slugs (MS-1, MS-2). More particularly,

- in this example, the booster antenna (BA) has a card antenna (CA) component extending around a periphery of the card body (CB), a coupler coil (CC) component disposed at a location for the antenna module (AM), and an extension antenna (EA) component disposed across a middle portion of the card body (CB) extending across the card body (CB) from the coupler coil (CC) component towards an inner edge (or winding) of the card antenna (CA) component.

the first metal slug component (MS-1) may be in the form of a rectangular metal frame disposed around (external to) the card antenna (CA) component of the booster antenna (BA). The first metal slug component (MS-1) may extend nearly all the way around the periphery of the card body (CB), interrupted by a gap between its two ends, thereby forming a discontinuous frame around the booster antenna (BA), and may occupy approximately 25% of the area of the card body (CB). The first metal slug component (MS-1) in this example (FIG. 2H) is similar to the first metal slug component (MS-1) in the previous example (FIG. 2G) except for the gap, which makes it a discontinuous metal frame (DMF) rather than a continuous metal frame (CMF). This may substantially avoid the metal frame (MS-1) from impairing coupling between the booster antenna and an external reader, and may provide a means for tuning the resonant frequency of the booster antenna.

the second metal slug component (MS-2) may be generally rectangular and may be disposed at a lower portion of the card body (CB), inside of the lower portion of the card antenna (CA) component, and up to the bottom edge of the extension antenna (EA) component. The second metal slug component (MS-2) may extend substantially all the way across the card body (CB), occupying approximately 20% of the area of the card body (CB). The second metal slug component (MS-2) in this example (FIG. 2H) may be similar to the first metal slug component (MS-1) in the previous example (FIG. 2G). No significant differences are noted.

The metal slug (MS-1) forms a discontinuous metal frame (DMF) extending around the perimeter (periphery) of the card body (CB) and may function in a manner similar to the compensation loop shown in FIG. 4A of US 20130126622. As disclosed therein, a conductive "compensation loop" CL may be disposed behind the booster antenna BA, extending around the periphery of the card body CB. The compensation loop CL may be an open loop having two free ends, and a gap ("gap") therebetween. The compensation loop CL may be made of copper cladding, can be printed on a support layer, etc.

Whereas the compensation loop (CL) disclosed in US 20130126622 may be disposed directly behind (on the reverse side of) the peripheral card antenna (CA) component, the metal slug components (MS-1) comprising the continuous metal frame (CMF) and discontinuous metal frame (DMF) may be disposed around, and external to the card antenna (CA) components of the booster antennas (BA).

The aforementioned US 20130126622 ("Finn '622") discloses a smartcard having a compensating loop with a gap. Refer to FIG. 4A therein, which shows a conductive "compensation loop" CL may be disposed (such as in Layer 5, FIG. 2) behind the booster antenna BA (Layer 3), extending around the periphery of the card body CB. The compensation loop CL may be an open loop having two free ends, and a gap ("gap") therebetween. The compensation loop CL may be made of copper cladding, can be printed on a support layer, etc.

The aforementioned U.S. Pat. No. 8,857,722 (Oct. 14, 2014; Mosteller, CPI) discloses weighted transaction cards may include a tungsten member that comprises at least a portion of a layer of the transaction card. The tungsten member may be disposed in an opening of a surround to define an inlay. A weighted mass comprising a tungsten member 10 may be inlaid into a surround 22 as depicted in FIG. 1. The surround 22 may comprise, for example, a polymer material. With reference to FIG. 3, the assembly including the tungsten member 10 inlaid and encapsulated within the opening 20 of the sheet 22 and the film layers 40 applied thereto may be referred to as inlay 100. Turning to FIG. 5, the inlay 100 may be provided between a graphics 210 layer and a second graphics layer 220. Furthermore, the inlay 100, the first graphics layer 210, and the second graphics layer 220 may be disposed between a first transparent film layer 230 and a second transparent film layer 240. With reference to FIG. 13, the inlay 100 may be provided with an antenna 28 (e.g., to facilitate wireless or contactless communication with a finished transaction card). With further reference to FIGS. 14A and 14B, various embodiments of the positioning of the antenna 28 relative to the inlay 100 are shown. For example, as shown in FIG. 14A, the antenna 28 may be disposed on a surface of the surround 22.

It appears, in Mosteller, that the antenna 28 is always located outside of the tungsten member 10. (The tungsten member 10 is inlaid and encapsulated within the opening 20 of the sheet 22, and the antenna 28 may be disposed on a surface of the surround 22.

The embodiment of FIG. 2G differs from Finn '622 in that (at least, inter alia) Finn 622's compensation loop (CL) is disposed under the booster antenna. In contrast thereto applicant's continuous metal frame (CMF) is disposed outside of the antenna (BA, CA)—in other words, applicant's antenna is disposed internal to the metal frame.

The embodiment of FIG. 2G differs from Mosteller in that (at least, inter alia) (i) Mosteller's tungsten member is not a frame (the surround is a frame), and (ii) applicant's continuous metal frame (CMF) is disposed outside of the antenna (BA, CA)—in other words, applicant's antenna is disposed internal to the metal frame.

The embodiment of FIG. 2H differs from Finn '622 similarly to 2G, except that the frame is discontinuous (DMF).

The embodiment of FIG. 2H differs from Mosteller similarly to 2G, except that the frame is discontinuous (DMF).

The metal slugs (and slug components) disclosed herein may comprise tungsten and alloys of tungsten, and can be machined (or otherwise formed) in such a way as to allow for a booster antenna (BA) with its various antenna components (CA, CC, EA) to be inserted (such as embedded) or placed into or onto an inlay substrate supporting the metal slug. Generally, the metal slug (or slug components) may occupy a first area of the card body, and the booster antenna may occupy a second area of the card body which is separate from the first area. Sections may be removed from a metal slug to allow for non-shielding of the electromagnetic field around areas of the various components of the booster antenna (BA).

As shown in FIGS. 2B and 2F, in some embodiments, one or more of the antenna components may be disposed substantially outside the area of the metal slug, and some portions of the antenna components (such as a length of wire connecting two different booster antenna components) may pass across (or overlap) the metal slug.

In FIG. 2B there is one metal slug, and it is shown disposed entirely within peripheral card antenna (CA) component of the booster antenna (BA).

In FIG. 2F, there are two metal slugs, both of which are shown disposed entirely within peripheral card antenna (CA) component of the booster antenna (BA).

As shown in FIGS. 2G and 2H, in some embodiments, there are two metal slugs, an outer one of which (MS-1) may be disposed at a peripheral area of the card body (CB), external to the peripheral card antenna (CA) component of the booster antenna (BA).

Referencing FIG. 2D, the objective of integrating an LED or a surface mounted LED into an inductively coupled dual-interface smartcard may be to provide visual indication when the smartcard is in the near field range of a contactless reader or terminal, and to indicate the handshake of data communication between the smartcard and the reader. The LED is hardwire-connected to the wire ends of the booster antenna. The coupling coil of the booster antenna inductively couples with the antenna chip module. There is no physical connection between the various antenna components of the booster antenna and the antenna chip module. The booster antenna when loaded (presence of an antenna chip module) has a resonance frequency of approximately 11.8-13.56 MHz and the activation distance to trigger communication with the inductively coupled antenna chip module is approximately 4-6 cm. In unloaded mode (without the presence of an antenna chip module), the LED can be driven by the booster antenna when in the RF field of the reader. The illumination strength of the LED increases with proximity to the reader. The LED may blink or flicker at a frequency of 3 hertz when the RFID polling software of the reader interrogates the antenna chip module. The activation distance is marginally influenced by the loading of the LED. The AC voltage and current (power) generated by the booster antenna is sufficient to drive up to three LEDs. A resistor could be added to control the switch-on voltage of the LED relative to proximity with the reader. The LED can be used to protect the RFID silicon die in the antenna chip module from over-voltage from the inductive coupling with the booster antenna. The LED can be positioned in the card body, behind a hologram or underneath the antenna chip module. The LED can also be connected to the module antenna of the antenna chip module. The LED can be connected to the free ends of the booster antenna (BA), see FIG. 3.

U.S. Pat. No. 8,544,756 (Bosquet, Oberthur) discloses a smart card comprising an electronic component 26 of the surface-mounted type (SMC for "surface-mounted component"). In this example, the electronic component 26 is an LED. By way of example, the LED 26 is powered via the antenna 24 that is incorporated in the thickness of the body 12. Thus, the diode 26 forms an indicator lamp suitable for lighting up when near field communication takes place. By way of example, this may serve to inform the user of the card that communication is taking place properly, or on the contrary that it has failed. By way of example, and as shown in FIG. 1, the LED 26 is incorporated in decoration printed on the card 10, for example in the center of a pattern representing the sun.

The tungsten slug, tungsten with a copper content or alloys of tungsten can be machined in such a way as to allow for a booster antenna with its various antenna components to be embedded into or onto an inlay substrate supporting the metal slug. The antenna structures can reside outside the area of the metal slug or partially overlap the area of the metal. The separation distance between the antenna wires of the booster antenna and the metal slug or slugs can be prepared with magnetic shielding material.

Various techniques may be used to incorporate a metal slug into a card body frame for the purpose of producing a weighted magnetic stripe card or a contact smartcard. The metal slug may typically have a thickness of approximately 300 μm and a weight of approximately 13 grams.

Techniques to incorporate a metal slug into an inductively coupled dual-interface smartcard may be hitherto unknown. This requires the integration of a booster antenna with its various antenna components with the metal slug that provides the additional weight. A metal slug in a card body has corners which can cause dents or blemishes in the printed graphics when the card is subject to torsion or bending. To offset the movement of the metal slug in the card body the metal slug can be sandblasted (or otherwise treated or prepared) to provide a rough surface finish for better adhesive adhesion to a thin carrier layer. The edges of the metal slug can be rounded (such as radiussed), if necessary, using suitable mechanical techniques (such as sanding, tumbling, etc.).

The thin carrier layer can be made of fleece, cotton, mesh, paper or synthetic material such PVC, PC, PET-G or Teslin. The thin carrier layer may comprise magnetic particles incorporated into its structure or prepared with channels to accept magnetic particles, or may have magnetic particles on one or more of its surfaces.

The position (location) of the metal slug in a smartcard body may be below the magnetic stripe and several millimeters from the perimeter edge. Alternatively, the metal slug can be injected mold into an ABS core, or the metal slug resides in a recess or window in the layer which incorporates the booster antenna.

The use of a metal slug in the construction of a DIF smartcard can shift the resonance frequency of a booster antenna with its various antenna components. For example, a booster antenna with a nominal resonance frequency of 9 MHz may resonate at 13.56 MHz when implemented in a smartcard bearing a slug made of, for instance, solid tungsten metal. The presence of the metal slug in the smartcard may shift the resonance frequency and/or change power delivery to the RFID chip.

In the case of certain metals or metal alloys there may be significant eddy currents in the slug which cancel out the RF carrier wave. Additional shielding from eddy current losses in the form of magnetic particles may be required. Magnetic particles may also be used to adjust the resonance frequency. The magnetic particles may be located directly on the metal slug, being fixed in place by use of adhesive or may fill voids or cavities in the metal slug. The magnetic particles may be inserted into the smartcard attached to or embedded in a layer of plastic material such as PVC, PC, PET-G or a material such as Teslin. The magnetic particles may also be deposited in around the periphery of the metal slug such that the area covered by magnetic particles overlaps the booster antenna or the magnetic particles may cover all of the area of the smartcard. The booster antenna (and its various components) may be kept at a distance (such as a few hundred microns) from the metal slug and a gap (separation distance) therebetween may be filled or prepared with magnetic particles.

A hybrid metal/plastic smartcard may feature a front metal plate bearing the credentials of the card holder (name, card serial number and expiry date). The finish on the metal may be a powder or a PVD (physical vapor deposition) coating. Alternatively, the metal may be laser engraved with patterns or logos or may be textured by use of a laser. The metal may be stamped or embossed.

The back side of the card may comprise a synthetic layer made of PVC, PC, PET-G, Teslin or any other synthetic material. This plastic layer may be attached to the front metal plate by an adhesive layer. The adhesive may be loaded with magnetic particles to offset the effects of shielding caused by the metal plate. The metal plate may be non-magnetic and a poor electrical conductor. The back side of the card may feature a metallic or metal foil finish. The back side of the card may be a composite material containing a re-enforcing filler of graphene, graphite, carbon fiber or carbon nanotubes. The purpose of the re-enforcing filler is to increase the Young's modulus and toughness of the plastic backing of the smartcard.

The antenna module (AM) may be inserted into a pocket (recess) on the plastic back side of the DIF smartcard or in a pocket formed in the re-enforced plastic layer. In addition, a recess on the reverse side or non-exposed side of the metal plate on the front side may be provided through milling or etching, having a shape and size similar to the module antenna of the antenna chip module. In this manner, a stepped cavity may be milled out in the plastic side of the DIF metal plastic hybrid smartcard to accommodate an antenna module (AM). This cavity may be aligned with a cavity in the metal in order to accept the antenna chip module. The antenna chip module may be located on the same side of the DIF smartcard as other components traditionally found on the back side of smartcards such as the magnetic stripe, signature panel and hologram. Placing of the antenna chip module on this side of the smartcard enables easier manufacturing of the card and improves the RF communication of the smartcard with an RF reader when compared to placing the antenna chip module on the metal front side.

The antenna module (AM) may be disposed in an opening (OP) from the front side of the smart card. A recess on the reverse side or non-exposed side (underside) of the metal plate (slug) may be provided through milling or etching.

Incorporating an LED into the Card

FIG. 3 is a diagram of a smartcard (SC) 300 comprising a card body (CB) 302 and a booster antenna (BA) 330 with its wire ends connected to an electroluminescent component (an LED or any illuminating device) 340 without any physical connection to a chip module (not shown). The LED may be connected to free ends of the booster antenna. (The two ends of the booster antenna which are typically left unconnected, as "free ends". See, for example, "a" and "f" in FIG. 1).

The ends of the booster antenna may be connected to one or more electroluminescent components. The electroluminescent component may be a commercially available device (for example blue backlighting commonly used in LCD panels), an organic light emitting diode (OLED) or a composite system containing electroluminescent particles suspended in an electrically conductive polymer matrix. The electroluminescent component(s) will glow when the RFID device is placed in an RF field. The electroluminescent component(s) may be placed anywhere in the RFID device, the device having surface finishes that permit light transmission to the exterior of the device. In the case of a smartcard the electroluminescent component may be located on the booster inlay to facilitate ease of connection to the booster antenna. Alternatively, the electroluminescent component may be located on a second layer of the smartcard and be connected to the booster antenna using solder bumps. The outer layers of the smartcard may have transparent, semi-transparent or holographic finish, forming windows that permit light transmission to the exterior of the smartcard. These windows may be patterned or be in the form of a logo, such that the patterned area illuminates when the electroluminescent component is activated. A plurality of electroluminescent components may be connected to the booster antenna in order to give a plurality of illuminating regions of the RFID device.

The ends of the booster antenna in an RFID device may be electrically connected to a capacitor. The capacitor may be connected to another component, for example an LED or rechargeable battery. A rectifying circuit may also be used in conjunction with the capacitor. When placed in the RF field the capacitor charges, for example during the execution of a transaction in a payment smartcard. When the payment smartcard, or other RFID device, is removed from the RF field the capacitor discharges. The discharge current from the capacitor can be fed to an LED, or other light emitting device, to indicate that the transaction has been completed. This has the effect of briefly turning on or brightening the LED to act as verification that a transaction completed. At different voltage levels the color of the LED can change. Alternatively, the discharge current from the capacitor may be used to re-charge a battery.

Security Features

Security features may be provided for tungsten metal inserts, tungsten foils or non-magnetic metal foils having a high density (of approximately 19.3 gm/cc) used in the form of a stack, that are used to give weight to a smartcard body. The metal insert or stack may be laser or chemically etched with a pattern in the form of a logo, barcode or serial number. In the case of a stack of tungsten or non-magnetic foils one or more of the outer foil layers may be etched or punched with a pattern. Alternatively, an inner layer of the foil stack may carry a pattern such that the pattern is concealed by the remaining layers of the stack. The pattern formed will be visible under X-ray imaging, for example, as found in airport security scanners. This can allow authentication of the smartcard at security screening points where the high density metal such as tungsten may be incorrectly identified by an X-ray scanner as inorganic material, and normally treated as a suspect device. The pattern may be used as security feature to prevent fraud in smartcards bearing metal inserts. The metal slugs, and components thereof, disclosed herein, may be engraved with patterns or logos or textured by use of a laser, stamped or embossed.

In an embodiment of the invention, the booster antenna may be used to drive a one-time password generator or a display.

Metal Slugs Having Portions Extending to the Periphery of the Card Body

FIG. 4A is a view of a smart card (SC) 400 having a card body (CB) 402 and a metal slug (MS) 420. The metal slug (MS) is generally rectangular, having a main body portion which may be slightly smaller than the card body, such as a few millimeters smaller, all around. Two protrusions (which may be referred to as "arms" or "ears") 420a and 420b extend from two corners of the main body portion of the metal slug to corresponding two corners of the card body—in this example, to the top left and bottom left corners of the card body (as viewed). There may be at least one protrusion, including four protrusions.

The slug has an opening (WO) 410 for accepting insertion of an antenna module (AM, not shown). The two ears are disposed at adjacent corners of the (rectangular) card body, but could be disposed at opposite corners of the card body (such as top-right and bottom-left) and, more generally, there can be "at least one" ear extending to a given corner of the card body.

A slit or slot (S) 450 extends from the opening (WO) to the perimeter (a peripheral or outer edge) of the metal slug (MS). This slit renders the slug discontinuous (not a "continuous metal layer). The slug comprises a non-conductive path around the metal area surrounding the antenna module (AM) and thus the electromagnetic flux lines may not be attenuated to the extent that they would be attenuated with a continuous metal slug (without the slit). In the manner of the coupling frames (CF) which may be disclosed in some of the parent applications, the discontinuous metal slug (DMS) 420 may act as a coupling frame (CF), enhancing coupling between the module antenna (MA) in the antenna module (AM) and an external contactless reader (refer to FIG. 1). A booster antenna (BA) is not shown, since the discontinuous metal slug acting as a coupling frame may negate the need for a booster antenna. The slit or slot renders the metal slug as a non-conductive path around the metal area surrounding the antenna chip module and thus the electromagnetic flux lines are not attenuated. In the manner of a coupling frame, the metal slug may be disposed substantially coplanar with and closely adjacent to the module antenna (MA) in the antenna module (AM), including an inner edge of the metal slug overlapping at least some outer turns of the module antenna (MA), including almost all of the turns of the module antenna (MA). Refer, for example, to US 20140361086 (U.S. Pat. No. 9,475,086) and US 20150021403 (U.S. Pat. No. 9,798,968). The coupling frame may overlap some of or substantially all of the turns (or tracks) of the module antenna. The coupling frame may overlap all of the turns of the module antenna, and may extend beyond all the turns of the module antenna into (above or below) an interior area of the module antenna. An LED can be connected across the slit (S) in the coupling frame (CF).

Alternatively, the main body of the metal slug may extend substantially to the periphery of the card body (and therefore constitute the card body), without requiring the protruding ears (420a,b). This variation may resemble some embodiments of coupling frames disclosed in US 20140361086 (U.S. Pat. No. 9,475,086), wherein (for example):

- A conductive coupling frame (CF) having two ends, forming an open loop having two ends or a discontinuous metal layer disposed surrounding and closely adjacent a transponder chip module, and substantially coplanar with an antenna structure in the transponder chip module. A metal card body or a transaction card with a discontinuous metal layer having a slit (S) or a non-conductive strip (NCS, 1034) extending from a module opening (MO) to a periphery of the card body to function as a coupling frame (CF). The coupling frame (CF) may be thick enough to be non-transparent to RF at frequencies of interest.
- FIG. 2D is a diagram, partially in perspective and partially in cross-section, showing a transponder chip module (TCM) disposed in the card body (CB) of metal smartcard (SC), or metal card (MC), wherein substantially the entire card body (CB) comprises metal, and may be referred to as a metal card body (MCB).
- For a metal card (MC), the back (bottom, as viewed) of the metal card body (MCB) should be open (free of metal, non-conductive) to avoid attenuation of the electromagnetic field. In other words, the opening (CO, or MO) should extend completely through the card body.
- A slit (or slot, or gap, or band) (S) 230 may be provided through the metal card body (MCB) so that it can function as a coupling frame (CF) for capacitive coupling with a contactless reader. An LED can be connected across the slit in the coupling frame.
- A card body (CB) with a coupling frame (CF), or a metal card body (MCB) modified (such as with a slit) to act as a coupling frame (CF) may be provided as an interim product, into which a transponder chip module (TCM) may later be installed.

Activation and read/write distances of at least a few centimeters (cm) are desirable. However, conventional antenna modules (AM) may require a booster antenna (BA) in a card body (CB) to achieve these distances. As disclosed herein, smartcards having an antenna module (AM) and a coupling frame (CF) may be able to operate without a booster antenna (BA) in the card body (CB). An activation distance for a transponder chip module (TCM) disposed in the opening of the coupling frame (CF) may be at least 20 mm; at least 25 mm; at least 30 mm; at least 35 mm; up to 40 mm; and more than 40 mm.

Performance of the smartcard (SC) may further be improved when the antenna module (AM) or transponder chip module (TCM) has a laser-etched planar antenna structure (LES). Laser etching facilitates smaller feature sized than chemical etching. For example, with a planar antenna structure in the form of a rectangular spiral (one long track forming a spiral) having several turns, with laser etching the width of the track may be less than 100 µm, and the spacing between adjacent turns of the spiral may be 25 µm or less.

Sheets of non-conductive material, such as printed sheets, may be disposed on one or both sides of the slug, covering the slit, which may enhance the structural integrity of the slug (MS) at the slit (S). The slit may be filled or covered with a dielectric or oxide layer. The may be covered on both sides with a layer of plastic, thus covering the slit.

The metal slug (MS) may be generally rectangular, slightly smaller than the card body (CB). For example, the card body may measure 85.6 mm across (from left-to-right, as viewed) and 54 mm high (from top-to-bottom, as viewed, and the metal slug may measure 72.9 mm across, and 33-42 mm high, leaving a peripheral area of plastic around the metal slug.

A logo ("LOGO") may be incorporated on the body of the metal slug, such as by etching and the like. The logo may be formed in a metal slab or metal layer or metal composite material or a layer of metal particles forming part of a dual-interface metal smartcard. A logo may be formed in a metal slab or metal layer forming part of a dual-interface metal smartcard.

The ear-shaped portions of the metal slug may extend entirely to the perimeter of the card body (CB). In FIG. 4A, two such ear-shaped portions 420a, 420b are shown, a first one of these ears extending from a first position of the main body of the metal slug to the top left (TL) corner of the card body, another of these ears extending from a different position of the main body of the metal slug to the bottom left (BL) corner of the card body. Alternatively, the second ear could extend to the bottom right (BR) corner of the card body, diagonally across from the top left (TL) corner and the first ear extension, or to the top right (TR) corner of the card body. The extensions (or "ears") of the metal slug may extend to the periphery of the card body at positions other than the corners thereof.

FIG. 4B (similar to FIG. 4A) illustrates a view of a metal slug having a substantially rectangular main body portion disposed in a card body of a smart card and located a few millimeters within the periphery of the card body. In this example, four arms or ears 420a, 420b, 420c, 420d extend from four corners of the main body portion of the slug to corresponding four corners of the card body.

The embodiments of FIG. 4A,B differ from Finn '622 in that (at least, inter alia) Finn 622's compensation loop (CL) is in the form of a frame extending around a peripheral area of the card body, under the booster antenna. In contrast thereto applicant's metal slug (MS) 420 occupies substantially the entire area of the card body, has an opening (WO) accepting an antenna module (AM) and a slit or slot (S) 450 extending from the opening (WO) to the perimeter (a peripheral or outer edge) of the metal slug (MS). This slit renders the slug discontinuous (not a "continuous metal layer).

The embodiment of FIG. 4A,B differ from Mosteller in that (at least, inter alia) at least one protrusion of the metal slug (MS) extend from corners of the main body portion of the metal slug to corresponding corners of the card body.

Some Additional Comments

Dual-interface (DI or DIF) smartcards (more generally, secure documents) may comprise an antenna module (AM) with a number of (typically 6 or 8) contact pads (CP) connected with an RFID chip (CM) via wire bonds or flip chip assembly, and a booster antenna (BA) in the card body (CB) consisting of a card body antenna (CA), an extension antenna (EA) and coupling coil (CC) which inductively couples with the module antenna (MA) of the antenna module (AM). The RFID chip may be referred to as a "chip IC".

The booster antenna (BA) may comprise various antenna components, such as a card body antenna (CA) for coupling with an external contactless reader, an extension antenna, and a coupling coil (CC) for coupling with the module antenna (MA) of the antenna module (AM).

The antenna module AM may generally comprise a "DI" RFID chip (bare, unpackaged silicon die) or chip module (a die with leadframe, carrier, redistribution substrate, interposer or the like)—either of which may be referred to as "CM"—mounted to a module tape "MT". A module antenna "MA" may be disposed on the module tape MT for implementing a contactless interface. An array of contact pads "CP" may be disposed on the module tape MT for implementing the contact interface.

The overall dimensions of the antenna module (AM) may be approximately 11.8 mm×13 mm (8 contact pad) or 10.6 mm×8.0 mm (6 contact pad). The overall dimensions of the card body (CB) may be approximately 54 mm×86 mm. The overall dimensions and pattern of the contact pads (CP) may be specified by ISO 7816. The contact pads (CP) occupy a "contact pad area" on the face-up side of the antenna module (AM), and may have a thickness of approximately 30 µm (30 microns) as standard.

It is a general object of the invention to provide techniques for improving the operation of RFID devices (smartcards, tags and the like) having antenna modules AM and operating at least in a contactless mode (ISO 14443).

Some of the techniques disclosed herein may be applicable to dual-interface (or dual-interface, contact and contactless interfaces) or single interface (contactless only) smartcards (or other RFID devices), including smartcards with metallization ("metal" smartcards). Some of the techniques disclosed herein may be applicable to small form factor transponder devices.

The claims presented hereinbelow may be directed to the embodiments of:

FIG. 2G (1,2) showing a metal hybrid dual-interface smartcard (MC) 200 having two metal slug components (MS-1, MS-2) 220D, 220E at positions in the card body in which the various antenna components of the booster antenna (BA) are not present. The first metal slug component is in the form of a rectangular, continuous metal frame (CMF) disposed around (external to) the card antenna (CA) component of the booster antenna (BA).

FIG. 2H (1,2) showing a metal frame similar to the metal frame of FIG. 2G, but in FIG. 2H the frame is discontinuous metal frame (DMF), having a gap (G) or slit (S) 250 in the frame (MS-1), extending from an inner edge of the frame to an outer edge thereof, so it is not a "closed loop".

FIG. 4A,B showing a generally rectangular metal slug (MS) having a main body portion which may be slightly smaller than the card body, and having two (4A) or four (4B protrusions extending from two or four corners of the main body portion of the metal slug to corresponding two or four corners of the card body (CB).

While the invention(s) has/have been described with respect to a limited number of embodiments, these should not be construed as limitations on the scope of the invention(s), but rather as examples of some of the embodiments. Those skilled in the art may envision other possible variations, modifications, and implementations that are also within the scope of the invention(s), and claims, based on the disclosure(s) set forth herein.

What is claimed is:

1. A dual-interface metal hybrid smartcard comprising:
   a plastic card body (CB);
   a booster antenna (BA) disposed in the card body and comprising a card antenna (CA) component disposed around a peripheral area of the card body, a coupler coil (CC) component disposed at an interior area of the card body around an opening (OP) for receiving an antenna module (AM) or transponder chip module (TCM); and
   a metal frame (CMF, DMF) disposed in the card body, in the form of a rectangular metal frame disposed external to the card antenna (CA) component of the booster antenna (BA);
   wherein:
   the metal frame comprises a first metal slug component (MS-1) which extends substantially all the way around the periphery of the card body (CB) in a continuous manner, forming a continuous metal frame (CMF) around the booster antenna (BA); and
   further comprising:
   a second metal slug component (MS-2) disposed at a lower portion of the card body (CB), inside of the lower portion of the card antenna (CA) component.

2. The smartcard of claim 1, wherein:
   the booster antenna further comprises an extension antenna (EA) component extending across another interior area of the card body; and
   the second metal slug component extends up to the bottom edge of the extension antenna (EA) component.

3. The smartcard of claim 1, wherein:
   the metal frame comprises a first metal slug component (MS-1) which extends substantially all the way around the periphery of the card body (CB) in a discontinuous manner, having a gap (G) or slit (S) extending from an inner edge of the frame to an outer edge thereof, so it is not a "closed loop", thereby forming a discontinuous metal frame (DMF) around the booster antenna (BA).

4. The smartcard of claim 3, further comprising:
a second metal slug component (MS-2) disposed at a lower portion of the card body (CB), inside of the lower portion of the card antenna (CA) component.

5. The smartcard of claim 3, wherein:
the booster antenna further comprises an extension antenna (EA) component extending across another interior area of the card body; and
the second metal slug component extends up to the bottom edge of the extension antenna (EA) component.

6. The smartcard of claim 3, wherein:
the slit (S) is located at a corner of the metal frame (MS-1).

7. The smartcard of claim 3, wherein:
the slit (s) is located at any suitable position along the extent of the frame, extending from an inner edge of the frame to the outer edge thereof.

8. The smartcard of claim 1, further comprising:
an antenna module disposed in the card body.

9. The smartcard of claim 8, wherein:
the antenna module is a dual-interface module.

10. Smartcard, comprising:
a plastic card body (CB) having four corners; and
a generally rectangular metal slug (MS) having a main body portion slightly smaller than the card body, and having at least one protrusion extending from corresponding at least one corner of the main body portion of the metal slug to corresponding at least one corner of the card body;
wherein:
the metal slug has two protrusions extending from two corners of the main body portion of the metal slug to corresponding two corners of the card body.

11. The smartcard of claim 10, wherein:
the metal slug has four protrusions extending from four corners of the main body portion of the metal slug to corresponding four corners of the card body.

12. The smartcard of claim 10, wherein:
the metal slug has an opening (WO) for accepting insertion of an antenna module (AM).

13. The smartcard of claim 12, further comprising:
a slit or slot (S) extending from the opening (WO) to an outer edge of the metal slug.

14. The smartcard of claim 13, wherein:
the slit is filled or covered with a dielectric or oxide layer or with a layer of plastic on at least one side thereof.

15. The smartcard of claim 10, wherein:
the main body of the metal slug extends extend substantially to the periphery of the card body.

16. The smartcard of claim 10, further comprising:
an antenna module disposed in the card body.

17. The smartcard of claim 10, wherein:
the antenna module is a dual-interface module.

* * * * *